United States Patent
Iida et al.

(10) Patent No.: US 7,834,797 B2
(45) Date of Patent: Nov. 16, 2010

(54) SWITCHED CAPACITOR CIRCUIT, SWITCHED CAPACITOR FILTER, AND SIGMA-DELTA A/D CONVERTER

(75) Inventors: Sachio Iida, Chiba (JP); Atsushi Yoshizawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/273,287

(22) Filed: Nov. 18, 2008

(65) Prior Publication Data
US 2009/0135039 A1    May 28, 2009

(30) Foreign Application Priority Data
Nov. 28, 2007    (JP)    ............................ P2007-307826

(51) Int. Cl.
*H03M 1/12*    (2006.01)
(52) U.S. Cl. ........................ 341/172; 341/122; 341/143; 341/155
(58) Field of Classification Search ................. 341/122, 341/143, 155, 172
See application file for complete search history.

(56) References Cited

U.S. PATENT DOCUMENTS

| | | | | |
|---|---|---|---|---|
| 5,189,637 | A * | 2/1993 | Eriksson ..................... | 708/819 |
| 5,235,335 | A * | 8/1993 | Hester et al. ................. | 341/172 |
| 5,459,464 | A * | 10/1995 | Beneteau et al. ............. | 341/143 |
| 5,617,093 | A * | 4/1997 | Klein ........................ | 341/172 |
| 6,025,794 | A * | 2/2000 | Kusumoto et al. ........... | 341/172 |
| 6,275,178 | B1 * | 8/2001 | Koifman et al. ............. | 341/143 |
| 6,819,281 | B2 * | 11/2004 | Fujita et al. ................. | 341/172 |
| 6,970,126 | B1 * | 11/2005 | O'Dowd et al. ............. | 341/172 |
| 7,295,143 | B2 * | 11/2007 | Ambo et al. ................ | 341/172 |
| 7,439,892 | B1 * | 10/2008 | Schneider et al. ........... | 341/143 |
| 7,679,422 | B1 * | 3/2010 | Thiagarajan et al. ........ | 327/337 |
| 2003/0146862 | A1 * | 8/2003 | Gandolfi et al. ............. | 341/120 |
| 2007/0008208 | A1 * | 1/2007 | Lakdawala et al. .......... | 341/172 |

OTHER PUBLICATIONS

J. Oliveira et al., "Low-Power CMOS Comparator with Embedded Amplification for Ultra-high-speed ADCs," Circuits and Systems, 2007, ISCAS 2007, IEEE International Symposium O N, IEEE, PI, pp. 3602-3605 (May 1, 2007).

F. Chen et al., "A 0.25-mW Low-Pass Passive Sigma-Delta Modulator with Built-In Mixer for a 10-MHz IF Input," IEEE Journal of Solid-State Circuits, vol. 32, No. 6, pp. 774-782 (Jun. 1, 1997).

European Search Report in EP 08 25 3601 (May 20, 2009).

F. Chen, et al., "A 1.5V 1mA 80dB Passive ΣΔADC in 0.13μm Digital CMOS Process", IEEE International Solid-State Circuits Conference, Digest of Technical Papers, pp. 54-55 (2003).

F. Chen, et al., "A 0.25mW 13b Passive ΣΔ Modulator for a 10MHz IF Input", IEEE International Solid-State Circuits Conference, Digest of Technical Papers, pp. 58-59 (1996).

* cited by examiner

*Primary Examiner*—Linh V Nguyen
(74) *Attorney, Agent, or Firm*—Finnegan, Henderson, Farabow, Garrett & Dunner, L.L.P.

(57) ABSTRACT

A switched capacitor circuit includes a capacitor that performs sampling, a first switch that is provided between the capacitor and an input terminal, and a second switch that is provided between the capacitor and an output terminal. The first switch and the second switch receive an input of a clock signal and turn on and off. The capacitor is a variable capacitance element in which the value of the capacitance changes in synchronization with the clock signal.

6 Claims, 23 Drawing Sheets

US 7,834,797 B2

SWITCHED CAPACITOR CIRCUIT, SWITCHED CAPACITOR FILTER, AND SIGMA-DELTA A/D CONVERTER

CROSS REFERENCES TO RELATED APPLICATIONS

The present invention contains subjected matter related to Japanese Patent Application JP 2007-307826 filed in the Japan Patent Office on Nov. 28, 2007, the entire contents of which being incorporated herein by reference.

BACKGROUND OF THE INVENTION

1. Field of the Invention

The present invention relates to a switched capacitor circuit, a switched capacitor filter, and a sigma-delta A/D converter.

2. Description of the Related Art

A passive type switched capacitor filter that uses a switched capacitor circuit can serve as a discrete-time analog filter with low electric power consumption. It has also been reported that a sigma-delta type A/D converter in which the passive type switched capacitor filter is used as a loop filter operates at high speed even as its electric power consumption remains low (refer to Feng Chen, Bosco Leung, "A 0.25 mW 13b Passive ΣΔ Modulator for a 10 MHz IF Input," in IEEE Int. Solid State Circuits Conf. Dig. Tech. Papers, February 1996, pp. 58-59, and to Feng Chen, Srinath Ramaswamy, Bertan Bakkaloglu, "A 1.5V 1 mA 80 dB Passive ΣΔ ADC in 0.13 μm Digital CMOS Process," in IEEE Int. Solid State Circuits Conf. Dig. Tech. Papers, February 2003, pp. 54-55).

FIG. 15 is an explanatory figure for explaining a loop filter circuit 10a that, with regard to its filter function only, is equivalent to the loop filter in the sigma-delta A/D converter that uses the known passive type switched capacitor filter, described in Feng Chen, Bosco Leung, "A 0.25 mW 13b Passive ΣΔ Modulator for a 10 MHz IF Input," in IEEE Int. Solid State Circuits Conf. Dig. Tech. Papers, February 1996, pp. 58-59. FIG. 16 is an explanatory figure that shows that shows waveforms of clock signals that are input to the loop filter that is shown in FIG. 15. The symbols $\phi_1$ and $\phi_2$ adjacent to various switches in the loop filter circuit 10a shown in FIG. 15 indicate that those switches become on when the clock signals $\phi_1$ and $\phi_2$ shown in FIG. 16 respectively become high.

As shown in FIG. 15, the known loop filter circuit 10a is configured from capacitors $C_1$, $C_2$, $C_3$, $C_{R1}$, $C_{R2}$, $C_{R3}$ and from switches that control the accumulation of charges in and the discharge of charges from the capacitors. The portions of the loop filter circuit 10a shown in FIG. 15 that are enclosed by the broken lines labeled 11a, 11b, 11c perform operations that move charges through the capacitors $C_{R1}$, $C_{R2}$, $C_{R3}$ in two directions. For example, focusing on the portion enclosed by the broken line 11a, when the clock signal $\phi_2$ becomes high, an electric current flows to the capacitor $C_{R1}$ from an input terminal IN and a charge is accumulated in the capacitor $C_{R1}$. Then, when the clock signal $\phi_1$ becomes high, the charge that has been accumulated in the capacitor $C_{R1}$ is discharged. The accumulation and the discharge of the charge are thus performed according to the states of the clock signals $\phi_1$ and $\phi_2$. It can therefore be seen that the loop filter circuit 10a shown in FIG. 15 is the same sort of filter as a continuous-time RC filter circuit 10b that is shown in FIG. 17.

As shown in Feng Chen, Bosco Leung, "A 0.25 mW 13b Passive ΣΔ Modulator for a 10 MHz IF Input," in IEEE Int. Solid State Circuits Conf. Dig. Tech. Papers, February 1996, pp. 58-59, the sampling frequency for the loop filter circuit 10a in FIG. 15 is 10 MHz, the filter's poles are at 8 kHz and 34 kHz, and the zero point is at 750 kHz. Based on these conditions, the capacitances of the various capacitors in the loop filter circuit 10a in FIG. 15 are calculated as 0.2 pF for $C_{R1}$, 23 pF for $C_1$, 2.5 pF for $C_{R2}$, 0.5 pF for $C_2$, 2.5 pF for $C_{R3}$, and 4.15 pF for $C_3$. For the input and output voltages under these conditions, the frequency characteristics are shown in FIG. 18, and the arrangement of the poles and the zero points is shown in FIG. 19. In the graph of the frequency characteristics of the loop filter circuit 10a shown in FIG. 18, the horizontal axis is the frequency, and the vertical axis is the gain. In FIG. 19, the horizontal axis is the real number axis (Re), the vertical axis is the imaginary number axis (Im), the position of each pole is indicated by x, and the position of each zero point is indicated by ○.

SUMMARY OF THE INVENTION

A passive type switched capacitor filter is a passive type of filter that is configured from switched capacitors that are passive elements. Therefore, when the passive type switched capacitor filter is used for a loop filter in a sigma-delta A/D converter without producing any voltage gain in the filter's transfer characteristics, as shown in FIG. 18, a problem arises in that comparator noise become dominant and limits the dynamic range of the filter. Another problem is that an additional circuit such as a charge pump or the like must be added in order to expand the dynamic range.

The present invention addresses these issues and provides a switched capacitor circuit, a switched capacitor filter, and a sigma-delta A/D converter that are new and improved, that can produce a voltage gain, and that can be operated at high speed with low electric power consumption.

In order to address the issues described above, according to an embodiment of the present invention, there is provided a switched capacitor circuit that comprises a capacitor that performs sampling, a first switch that is provided between the capacitor and an input terminal, and a second switch that is provided between the capacitor and an output terminal. Each of the first switch and the second switch receives an input of a clock signal and turns on and off at different times than when the other of the first switch and the second switch respectively turns on and off. The capacitor is a variable capacitance element in which the value of the capacitance changes in synchronization with the clock signal.

In this configuration, the capacitor performs sampling, the first switch is provided between the capacitor and the input terminal, and the second switch is provided between the capacitor and the output terminal. The first switch and the second switch receive the input of the clock signal and turn on and off. The capacitor is the variable capacitance element in which the value of the capacitance changes in synchronization with the clock signal. Using the variable capacitance element in which the value of the capacitance changes in synchronization with the clock signal as the capacitor that performs the sampling makes it possible to carry out high-speed operation with low electric power consumption.

The capacitance of the variable capacitance element when the first switch is on may be greater than the capacitance of the variable capacitance element when the second switch is on. Using the variable capacitance element that has the high capacitance when the first switch, which is close to the input terminal, is on makes it possible to achieve a high voltage gain in the frequency characteristics.

The variable capacitance element may be configured from a metal oxide semiconductor (MOS) capacitor. Using the variable capacitance element that is configured from the MOS capacitor makes it possible to vary the capacitance according to whether the clock signal is high or low. This in turn makes it possible to achieve a high voltage gain in the frequency characteristics with a simple configuration, and to carry out high-speed operation while suppressing the electric power consumption.

In order to address the issues described above, according to another embodiment of the present invention, there is provided a switched capacitor filter that includes at least one of the switched capacitor circuit described above. This makes it possible to achieve a high voltage gain in the frequency characteristics and to carry out high-speed operation with low electric power consumption.

In order to address the issues described above, according to another embodiment of the present invention, there is provided a switched capacitor filter that includes a first switched capacitor circuit, a second switched capacitor circuit, and a third switched capacitor circuit, each of which is the switched capacitor circuit described above, as well as a first capacitor, a second capacitor, and a third capacitor. The first switched capacitor circuit is provided between the input terminal and the first capacitor. The second switched capacitor circuit is provided between the first capacitor and the second capacitor and between the first capacitor and the output terminal. The third switched capacitor circuit is provided between the third capacitor and the second capacitor and between the third capacitor and the output terminal.

A transfer function may be expressed by Equation 1 below.

$$H(z) = \frac{(1-\gamma \cdot z^{-1})\alpha\beta \cdot \frac{C_{R1}C_{R2}}{C_1 C_2} z^{-1.5}}{(1-\alpha \cdot z^{-1})(1-\beta \cdot z^{-1})(1-\gamma \cdot z^{-1}) -}$$
$$(1-\gamma \cdot z^{-1})\alpha\beta \cdot \frac{C_{R2}C_{r2}}{C_1 C_2} z^{-2} -$$
$$(1-\alpha \cdot z^{-1})\beta\gamma \cdot \frac{C_{R3}C_{r3}}{C_2 C_3} z^{-2}$$

$$\alpha = \frac{C_1}{C_1 + C_{r1} + C_{R2}}, \beta = \frac{C_2}{C_2 + C_{r2} + C_{R3}},$$
$$\gamma = \frac{C_3}{C_3 + C_{r3}}$$

Equation 1

$C_{R1}$, $C_{R2}$, $C_{R3}$ indicate the values of the capacitances in a case where the capacitances in the first to third switched capacitor circuits, respectively, are high, $C_{r1}$, $C_{r2}$, $C_{r3}$ indicate the values of the capacitances in a case where the capacitances in the first to third switched capacitor circuits, respectively, are low, and $C_1$, $C_2$, $C_3$ indicate the values of the capacitances of the first to third capacitors, respectively.

In order to address the issues described above, according to another embodiment of the present invention, there is provided a sigma-delta A/D converter that uses the switched capacitor filter described above as a loop filter that integrates a difference between an analog input signal and an analog return signal.

According to the embodiments of the present invention described above, using the variable capacitance element in which the value of the capacitance changes in synchronization with the clock signal as the capacitor that performs the sampling makes it possible to provide a switched capacitor circuit, a switched capacitor filter, and a sigma-delta A/D converter that are new and improved, that can produce a voltage gain, and that can be operated at high speed with low electric power consumption.

BRIEF DESCRIPTION OF THE DRAWINGS

FIG. 13 is an explanatory figure that shows frequency characteristics of a switched capacitor filter 210a;

DETAILED DESCRIPTION OF THE PREFERRED EMBODIMENTS

Figure 1:
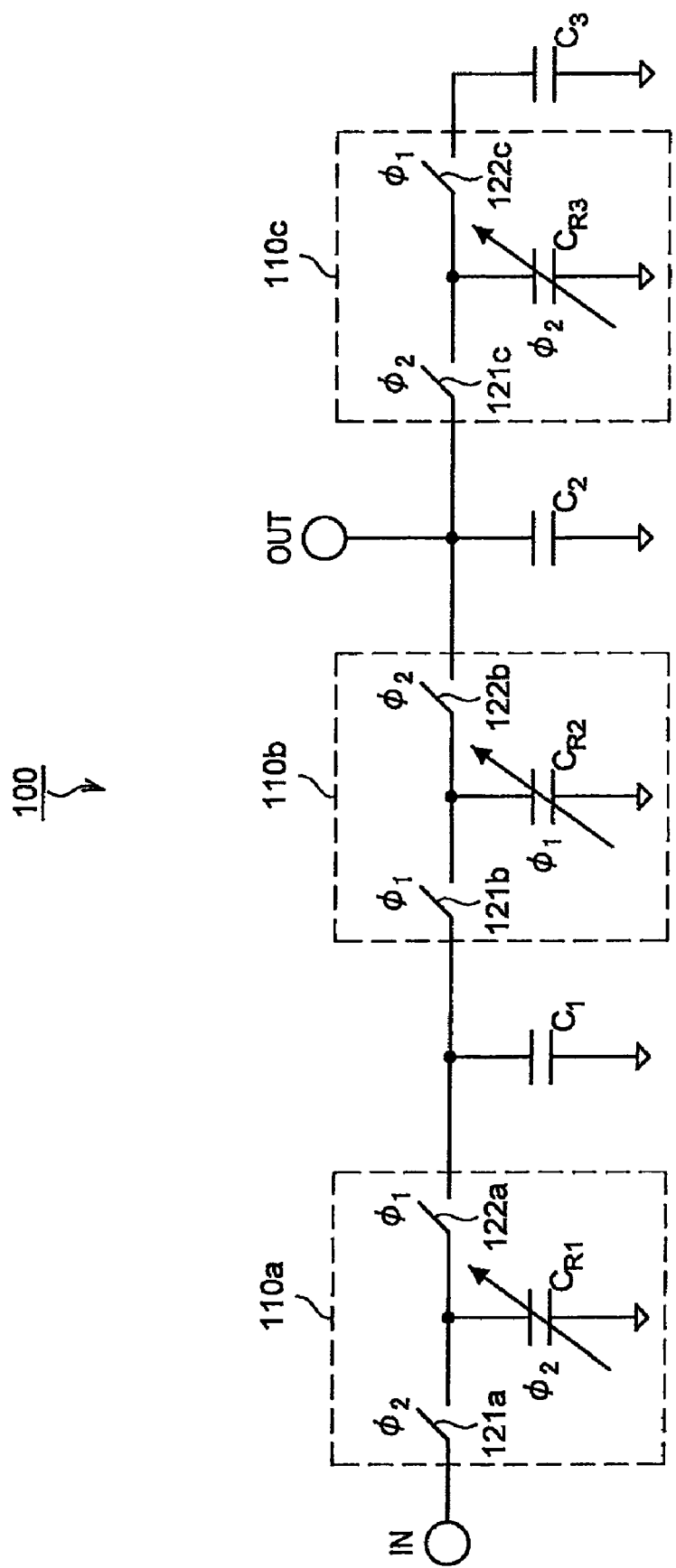
FIG. 1 is an explanatory figure for explaining a switched capacitor filter 100 according to a first embodiment of the present invention.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

First Embodiment

Figure 2:
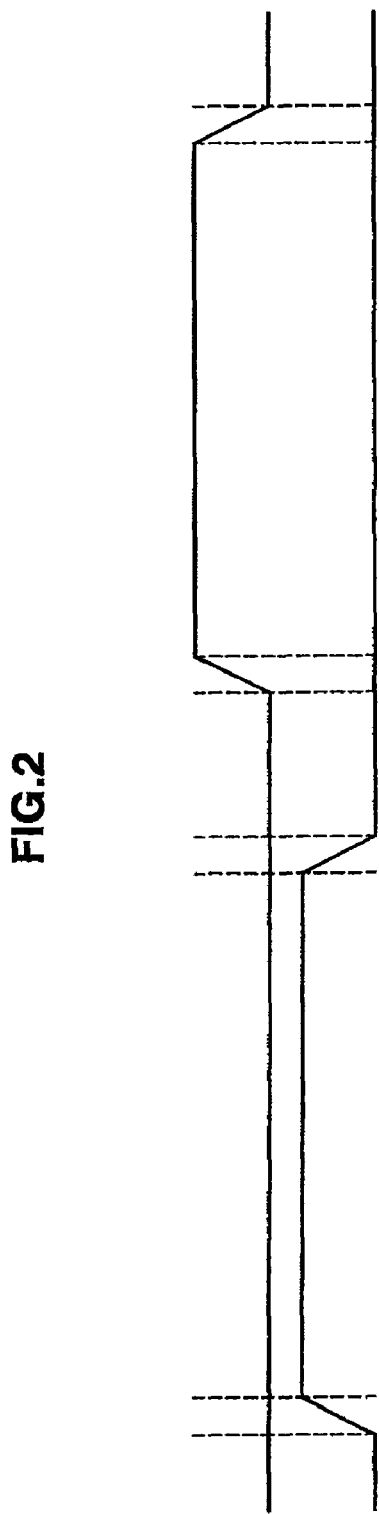
FIG. 2 is an explanatory figure that shows clock signals that are input to the switched capacitor filter 100 shown in FIG. 1.

First, a switched capacitor circuit according to a first embodiment of the present invention and a switched capacitor filter that uses the switched capacitor circuit will be explained. FIG. 1 is an explanatory figure for explaining a switched capacitor filter 100 according to the first embodiment of the present invention. FIG. 2 is an explanatory figure that shows clock signals that are input to the switched capacitor filter 100 shown in FIG. 1. The switched capacitor filter 100 according to the first embodiment of the present invention will be explained below using FIG. 1.

As shown in FIG. 1 the switched capacitor filter 100 according to the first embodiment of the present invention is configured such that it includes switched capacitor circuits 110a, 110b, and 110c and capacitors $C_1$, $C_2$, $C_3$.

The switched capacitor circuit 110a is configured such that it includes switches 121a, 122a and a capacitor $C_{R1}$ for sampling. In the same manner, the switched capacitor circuit 110b is configured such that it includes switches 121b, 122b and a capacitor $C_{R2}$ for sampling, and the switched capacitor circuit 110c is configured such that it includes switches 121c, 122c and a capacitor $C_{R3}$ for sampling.

Each of the capacitors for sampling $C_{R1}$, $C_{R2}$, $C_{R3}$ is a variable capacitance element that can vary its capacitance. A feature of the present embodiment is that the capacitors $C_{R1}$, $C_{R2}$, and $C_{R3}$ vary their capacitances in response to clock signals that are input to the switched capacitor filter 100. The symbols $\phi_1$, $\phi_2$ adjacent to the various switches in FIG. 1 correspond to the clock signals $\phi_1$ and $\phi_2$ shown in FIG. 2, and the switches are on when the corresponding clock signals are high. The symbols $\phi_1$, $\phi_2$ adjacent to the capacitors $C_{R1}$, $C_{R2}$, and $C_{R3}$ also correspond to the clock signals $\phi_1$ and $\phi_2$ shown in FIG. 2 and indicate that each capacitor has a greater capacitance when the corresponding clock signal is high than when the other clock signal is high. For example, the capacitance of the capacitor $C_{R1}$ is greater when the clock signal $\phi_2$ is high than when the clock signal $\phi_1$ is high.

Figure 3:
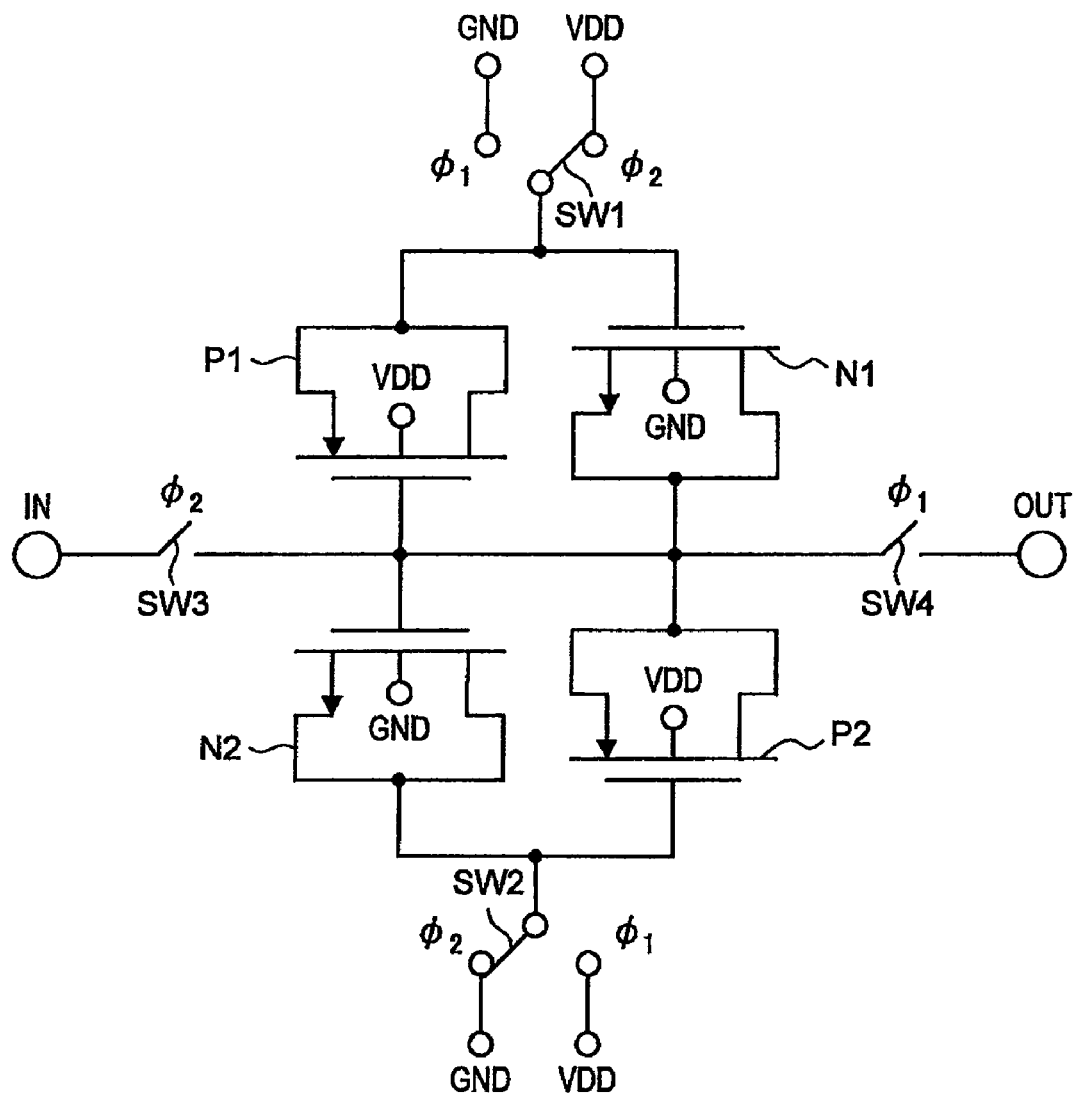
FIG. 3 is an explanatory figure that shows a configuration of a variable capacitance element that is an example of a variable capacitance element and that is configured from MOS capacitors.
Figure 4:
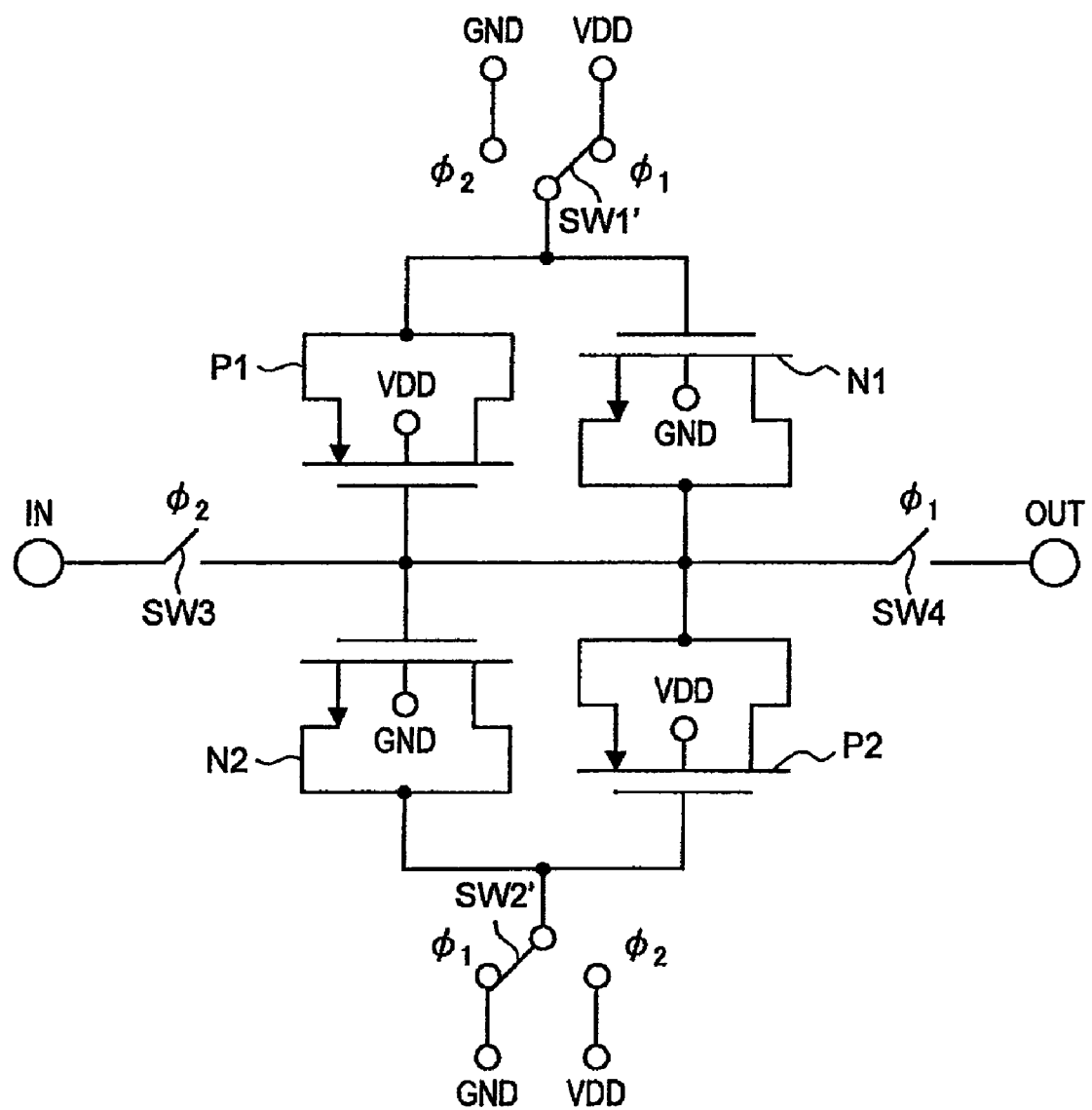
FIG. 4 is an explanatory figure that shows a configuration of a variable capacitance element that is an example of a variable capacitance element and that is configured from MOS capacitors.

FIGS. 3 and 4 are explanatory figures that show configurations of variable capacitance elements that are examples of the variable capacitance elements used by the present invention and that are configured from metal oxide semiconductor (MOS) capacitors. The configurations and operations of the variable capacitance elements that are examples of the variable capacitance elements and that are configured from the MOS capacitors will be explained below.

First, to explain using FIG. 3, the variable capacitance element that is configured from the MOS capacitors is configured such that it includes p-type metal oxide semiconductor field-effect transistors (p-MOSFETs) P1, P2, n-type MOSFETs (n-MOSFETs) N1, N2, and switches SW1, SW2.

Clock signals $\phi_1$ and $\phi_2$, such as those shown in FIG. 2, for example, are input to the variable capacitance element shown in FIG. 3.

The symbols $\phi_1$ and $\phi_2$ adjacent to the switches SW1, SW2 indicate what terminals are connected when one of the clock signals $\phi_1$ and $\phi_2$ in FIG. 2 becomes high. For example, in a case where the clock signal $\phi_1$ is high, the switch SW1 is connected to the ground (GND) side and the switch SW2 is connected to the VDD side. On the other hand, in a case where the clock signal $\phi_2$ is high, the switch SW1 is connected to the VDD side and the switch SW2 is connected to the GND side.

In the variable capacitance element shown in FIG. 3, a switch SW3 is on when the clock signal $\phi_2$ is high, such that the variable capacitance element is connected to an input terminal IN. Further, the switch SW1 is connected to VDD and the switch SW2 is connected to GND when the clock signal $\phi_2$ is high. In this state, a gate electrode of the n-MOSFET N1 is connected to VDD, and a source electrode and a drain electrode of the n-MOSFET N2 are connected to GND. In addition, a source electrode and a drain electrode of the p-MOSFET P1 are connected to VDD, and a gate electrode of the p-MOSFET P2 is connected to GND. In this state, the n-MOSFETs N1, N2 and the p-MOSFETs P1, P2 have accumulated charges, so this state is called a track state.

In the track state, inversion layers form at the semiconductor interfaces directly below the gate electrodes of the n-MOSFETs N1, N2 and the p-MOSFETs P1, P2, increasing their capacitances.

When the clock signal $\phi_2$ changes from high to low, both of the clock signals $\phi_1$ and $\phi_2$ are low, as shown in FIG. 2. During this interval, the switch SW3 is off, so the connection between the input terminal IN and the variable capacitance element is cut off, and the n-MOSFETs N1, N2 and the p-MOSFETs P1, P2 are in a state of retaining their accumulated charges. This state is called a hold state.

Then, when the clock signal $\phi_1$ changes from low to high, a switch SW4 becomes on, such that the variable capacitance element is connected to an output terminal OUT. When the clock signal $\phi_1$ is high, the switch SW1 is connected to GND, and the switch SW2 is connected to VDD. In this state, the gate electrode of the n-MOSFET N1 is connected to GND, and the source electrode and the drain electrode of the n-MOSFET N2 are connected to VDD. In addition, the source electrode and the drain electrode of the p-MOSFET P1 are connected to GND, and the gate electrode of the p-MOSFET P2 is connected to VDD. This state is a state in which the MOS capacitance of each of the MOSFETs is depleted and the voltage of the signal that is output increases, so this state is called a boost state.

In the boost state, the inversion layers that formed at the semiconductor interfaces directly below the gate electrodes of the n-MOSFETs N1, N2 and the p-MOSFETs P1, P2 disappear, decreasing their capacitances.

This increases the amount of the charge that is transmitted from the input terminal IN in the direction of the output terminal OUT and decreases the amount of the charge that is transmitted in the opposite direction, so directionality can be given to the circuit.

The variable capacitance element that is shown in FIG. 4 may be used in a case where an opposite directionality is desired for the circuit. With the variable capacitance element shown in FIG. 4, unlike the variable capacitance element shown in FIG. 3, the switch SW4 is on when the clock signal $\phi_1$ is high, such that the output terminal OUT and the variable capacitance element are connected. In addition, when the clock signal $\phi_1$ is high, the switch SW1 is connected to VDD and the switch SW2 is connected to GND, such that the variable capacitance element shown in FIG. 4 enters the track state.

Then, after both of the clock signals $\phi_1$ and $\phi_2$ have become low and the variable capacitance element has passed through the hold state, the switch SW3 becomes on when the clock signal $\phi_2$ changes to high, such that the variable capacitance element is connected to the output terminal OUT. In addition, when the clock signal $\phi_2$ is high, the switch SW1 is connected to GND and the switch SW2 is connected to VDD, such that the variable capacitance element shown in FIG. 4 enters the boost state. This increases the amount of the charge that is transmitted from the output terminal OUT in the direction of the input terminal IN and decreases the amount of the charge that is transmitted in the opposite direction, so directionality can be given to the circuit.

As described above, in the switched capacitor filter 100 shown in FIG. 1, the capacitor $C_{R1}$ has a greater capacitance when the clock signal $\phi_2$ is high. In the same manner, the capacitor $C_{R2}$ has a greater capacitance when the clock signal $\phi_1$ is high, and the capacitor $C_{R3}$ has a greater capacitance when the clock signal $\phi_2$ is high.

Each of the capacitors $C_{R1}$, $C_{R2}$, and $C_{R3}$ can be given a different directionality, so in the transfer function that is derived for the input and output voltages, shown below, uppercase subscripts ($C_{R1}$, $C_{R2}$, $C_{R3}$) are assigned to the capacitances when the left-side switches (the switches 121a, 121b, 121c) are closed in the switched capacitor filter 100 shown in FIG. 1, and lowercase subscripts ($C_{r1}$, $C_{r2}$, $C_{r3}$) are assigned to the capacitances when the right-side switches (the switches 122a, 122b, 122c) are closed.

$$H(z) = \frac{(1-\gamma \cdot z^{-1})\alpha\beta \cdot \frac{C_{R1}C_{R2}}{C_1 C_2} z^{-1.5}}{(1-\alpha \cdot z^{-1})(1-\beta \cdot z^{-1})(1-\gamma \cdot z^{-1}) -} \quad \text{Equation 2}$$
$$(1-\gamma \cdot z^{-1})\alpha\beta \cdot \frac{C_{R2}C_{r2}}{C_1 C_2} z^{-2} -$$
$$(1-\alpha \cdot z^{-1})\beta\gamma \cdot \frac{C_{R3}C_{r3}}{C_2 C_3} z^{-2}$$

$$\alpha = \frac{C_1}{C_1 + C_{r1} + C_{R2}}, \beta = \frac{C_2}{C_2 + C_{r2} + C_{R3}},$$
$$\gamma = \frac{C_3}{C_3 + C_{r3}}$$

Note that in the present invention, it is not necessary for all of the capacitors $C_{R1}$, $C_{R2}$, $C_{R3}$ to change their capacitances in response to the clock signals. A variable capacitance element may also be used for any one of the capacitors. Furthermore, in a case where variable capacitance elements are used for the capacitors $C_{R1}$, $C_{R2}$, $C_{R3}$, it is possible to set the directionality of the movement of the charges as desired, even in a direction other than that shown in FIG. 1.

The switched capacitor circuits 110a, 110b, and 110c perform operations that move charges in two directions through the capacitors for sampling $C_{R1}$, $C_{R2}$, $C_{R3}$, so the work they perform resembles the work of resistors. However, because the switched capacitor circuits 110a, 110b, and 110c have directionality in the movement of the charges, the switched capacitor circuits 110a, 110b, and 110c perform the same work as resistors that have directionality. If all of the charges move in one direction, then the charges are completely integrated, making it possible for the circuits to form an integrator, even though they are passive circuits that are configured only from passive elements. The principle of the present invention can therefore be used to configure a switched capacitor filter that is different from the known circuit. Moreover, using the switched capacitor filter that is different from the known circuit makes it possible for a wide variety of devices, such as a sigma-delta A/D converter, for example, to have superior properties.

Examples of the switched capacitor circuit according to the first embodiment of the present invention will be explained below.

First Example

Figure 5:
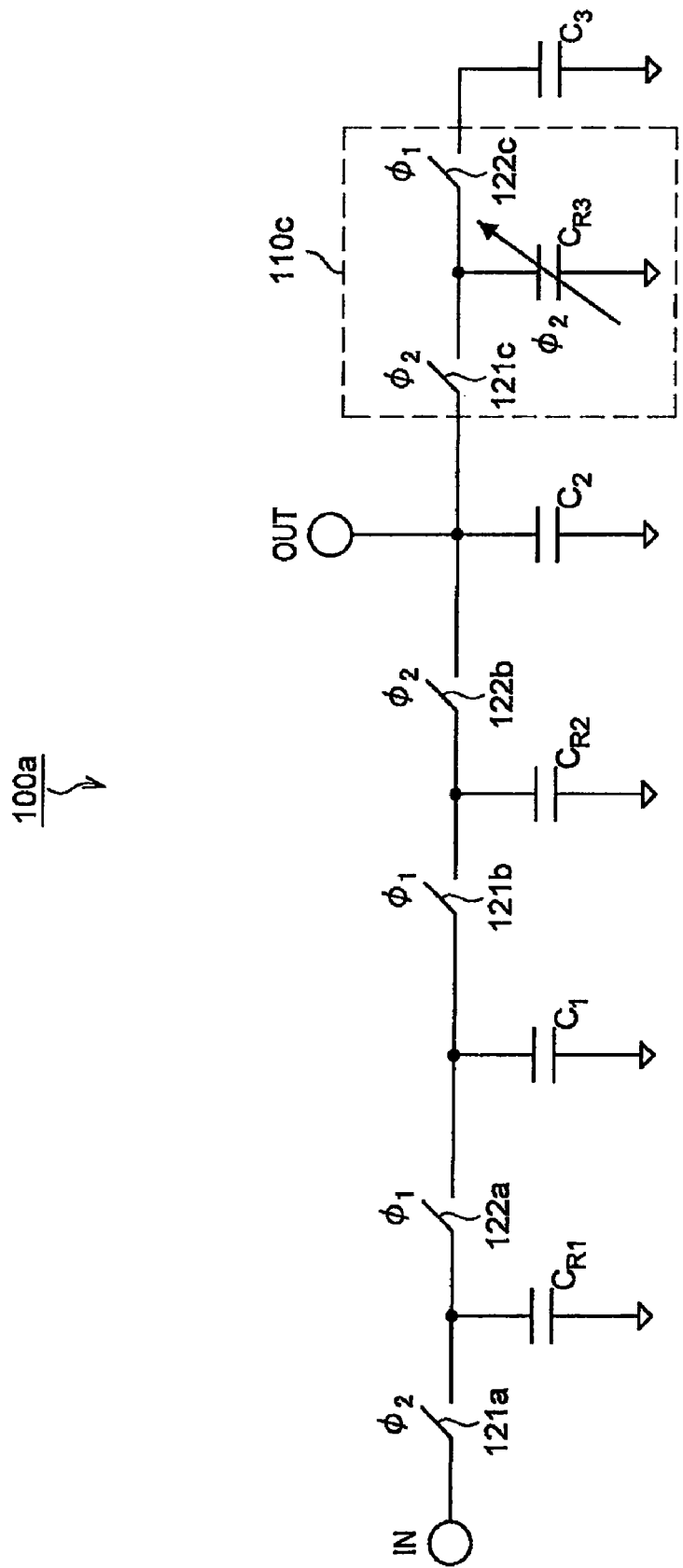
FIG. 5 is an explanatory figure for explaining a first example of the switched capacitor circuit according to the first embodiment of the present invention.

FIG. 5 is an explanatory figure for explaining a switched capacitor filter 100a that is a first example of the switched capacitor circuit according to the first embodiment of the present invention. The configuration and operation of the switched capacitor filter 100a will be explained below using FIG. 5.

The switched capacitor filter 100a shown in FIG. 5 uses a variable capacitance element only for the capacitor $C_{R3}$ in the switched capacitor filter 100 according to the first embodiment of the present invention shown in FIG. 1. The rest of its configuration is the same as the configuration of the switched capacitor filter 100 shown in FIG. 1. The capacitor $C_{R3}$ is a variable capacitance element that has been given directionality such that its capacitance becomes greater when a switch 121c is closed and its capacitance becomes smaller when a switch 122c is closed.

Figure 15:
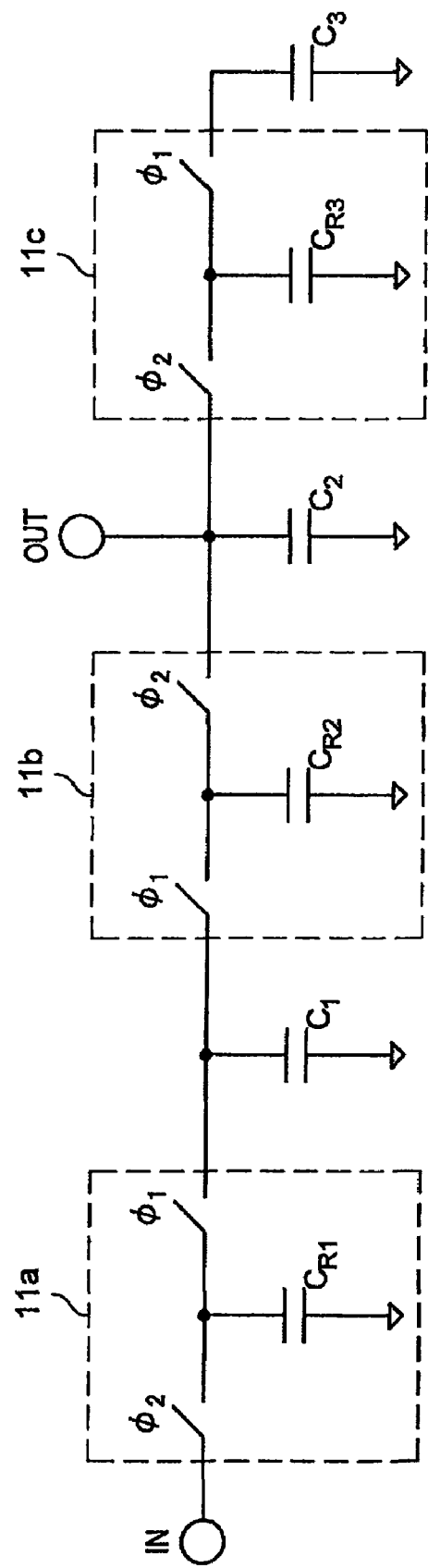
FIG. 15 is an explanatory figure for explaining a loop filter circuit 10a in a sigma-delta A/D converter that uses a known passive type of switched capacitor filter.

The sampling frequency for a loop filter circuit 10a that is shown in FIG. 15 is 10 MHz, the filter's poles are at 8 kHz and 34 kHz, and the zero point is at 750 kHz. The capacitances of the various capacitors are 0.2 pF for $C_{R1}$, 23 pF for $C_1$, 2.5 pF for $C_{R2}$, 0.5 pF for $C_2$, 2.5 pF for $C_{R3}$, and 4.15 pF for $C_3$. In order to make the frequency characteristics of the switched capacitor filter 100a the same as the frequency characteristics of the loop filter circuit 10a, the value of the capacitance of the capacitor $C_3$ may be reduced and the zero point may be put in the same position. In this case, if k is the capacitance change ratio of the capacitor $C_{R3}$, the value of the capacitance of the capacitor $C_3$ may be expressed as $C_3 = 4.15/k$ [pF].

Figure 6:
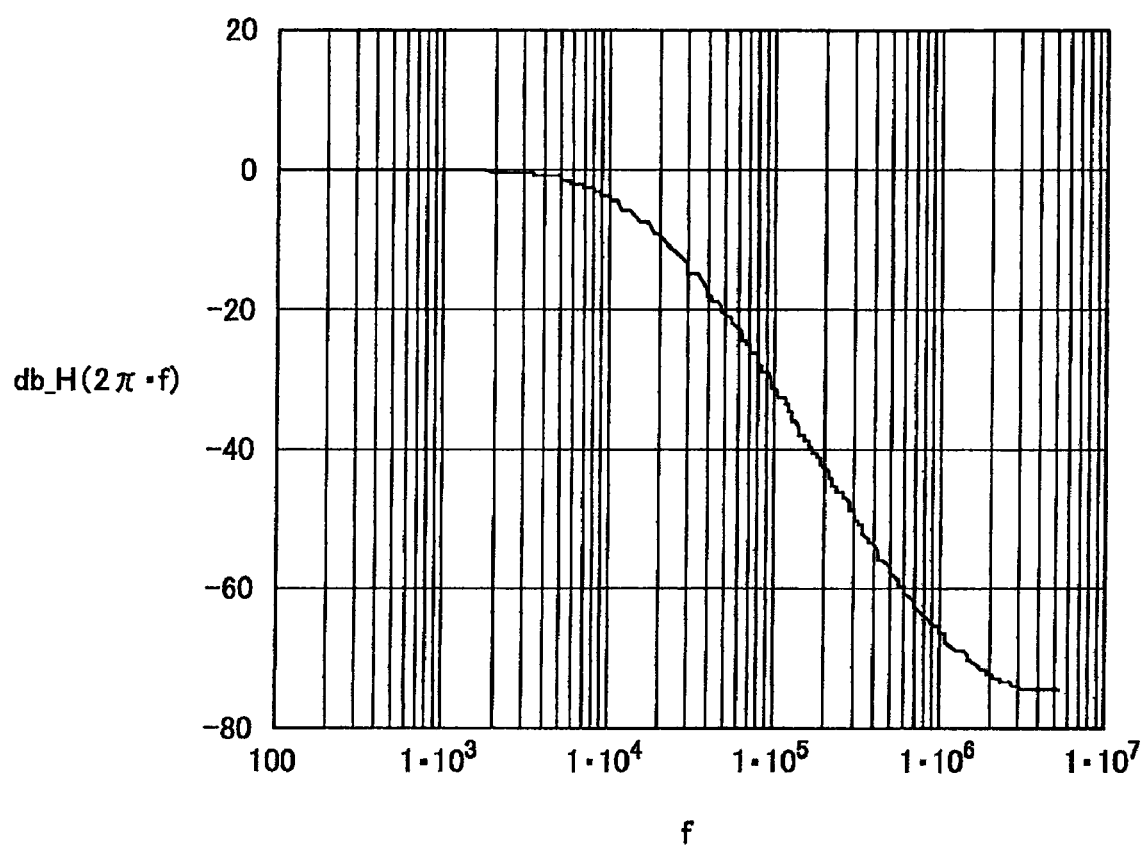
FIG. 6 is an explanatory figure that shows frequency characteristics for input and output voltages of a switched capacitor filter that is shown in FIG. 5.
Figure 7:
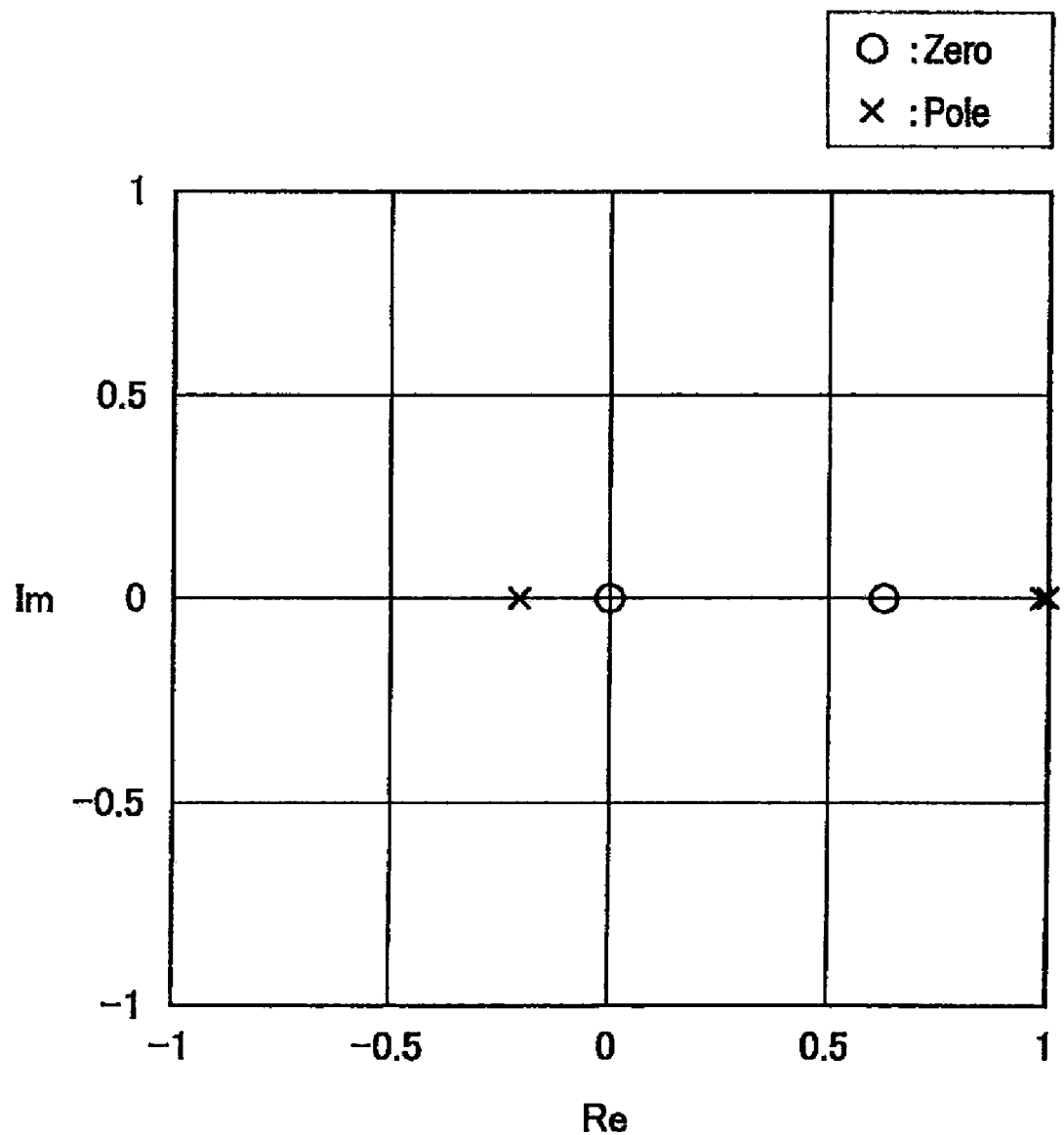
FIG. 7 is an explanatory figure that shows an arrangement of poles and zero points for the input and output voltages of the switched capacitor filter that is shown in FIG. 5.

The frequency characteristics of the switched capacitor filter 100a that are derived under these conditions are shown in FIG. 6, and the arrangement of the poles and the zero points is shown in FIG. 7. In the graph of the frequency characteristics of the switched capacitor filter 100a shown in FIG. 6, the horizontal axis is the frequency, and the vertical axis is the gain. In FIG. 7, the horizontal axis is the real number axis (Re), the vertical axis is the imaginary number axis (Im), the position of each pole is indicated by x, and the position of each zero point is indicated by ○. Naturally, the frequency characteristics and the arrangement of the poles and the zero points match those for the known loop filter circuit 10a shown in FIG. 15. However, in the switched capacitor filter 100a, the value of the capacitance of the capacitor $C_3$ can be made smaller than in the loop filter circuit 10a. In effect, therefore, the switched capacitor filter 100a can be mounted in a smaller surface area than can the loop filter circuit 10a.

Second Example

Figure 8:
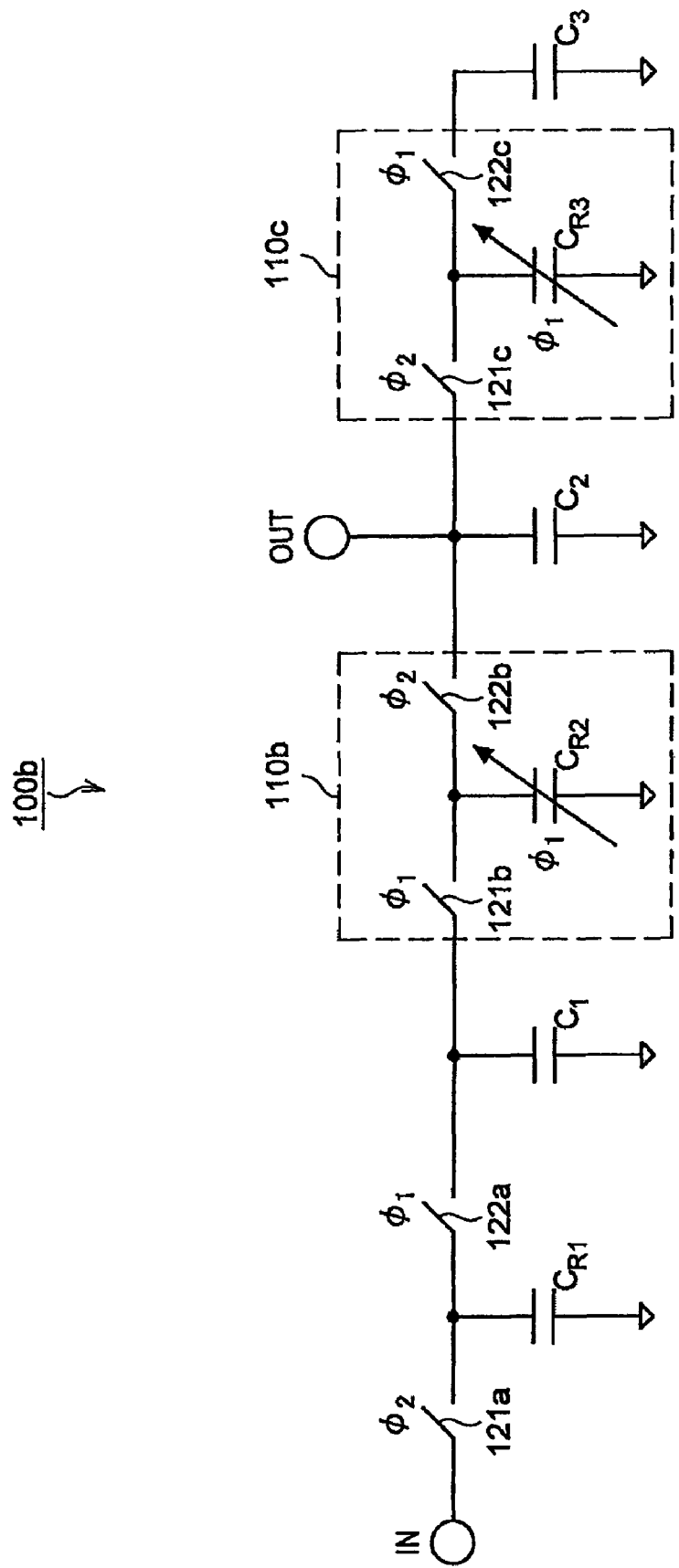
FIG. 8 is an explanatory figure for explaining a second example of the switched capacitor circuit according to the first embodiment of the present invention.

FIG. 8 is an explanatory figure for explaining a switched capacitor filter 100b that is a second example of the switched capacitor circuit according to the first embodiment of the present invention. The configuration and operation of the switched capacitor filter 100b will be explained below using FIG. 8.

The switched capacitor filter 100b shown in FIG. 8 uses variable capacitance elements for the capacitors $C_{R2}$ and $C_{R3}$ in the switched capacitor filter 100 according to the first embodiment of the present invention shown in FIG. 1. The rest of its configuration is the same as the configuration of the switched capacitor filter 100 shown in FIG. 1. The capacitor $C_{R2}$ is a variable capacitance element that has been given directionality such that its capacitance becomes greater when a switch 121b is closed and its capacitance becomes smaller when a switch 122b is closed. In contrast, the capacitor $C_{R3}$ is a variable capacitance element that has been given directionality such that its capacitance becomes greater when a switch 122c is closed and its capacitance becomes smaller when a switch 121c is closed.

The sampling frequency for the loop filter circuit 10a that is shown in FIG. 15 is 10 MHz, the filter's poles are at 8 kHz and 34 kHz, and the zero point is at 750 kHz. The capacitances of the various capacitors are 0.2 pF for $C_{R1}$, 23 pF for $C_1$, 2.5 pF for $C_{R2}$, 0.5 pF for $C_2$, 2.5 pF for $C_{R3}$, and 4.15 pF for $C_3$. In the same manner as in the first example, the frequency characteristics of the switched capacitor filter 100b may be made the same as the frequency characteristics of the loop filter circuit 10a by changing the values of the capacitances of the capacitors $C_2$ and $C_3$ and putting the zero point in the same position. However, because the value of 0.5 pF for the capacitance of the capacitor $C_2$ is small, the movement of the poles is slight, which can be tolerated. Therefore, the value of the capacitance of the capacitor $C_{R3}$ may also be made small in order to achieve the equivalent frequency characteristics. In this case, if k is the capacitance change ratio of the capacitor $C_{R3}$, the value of the capacitance of the capacitor $C_{R3}$ may be expressed as $$C_{R3} = 2.5/k \text{ [pF]}.$$

Figure 9:
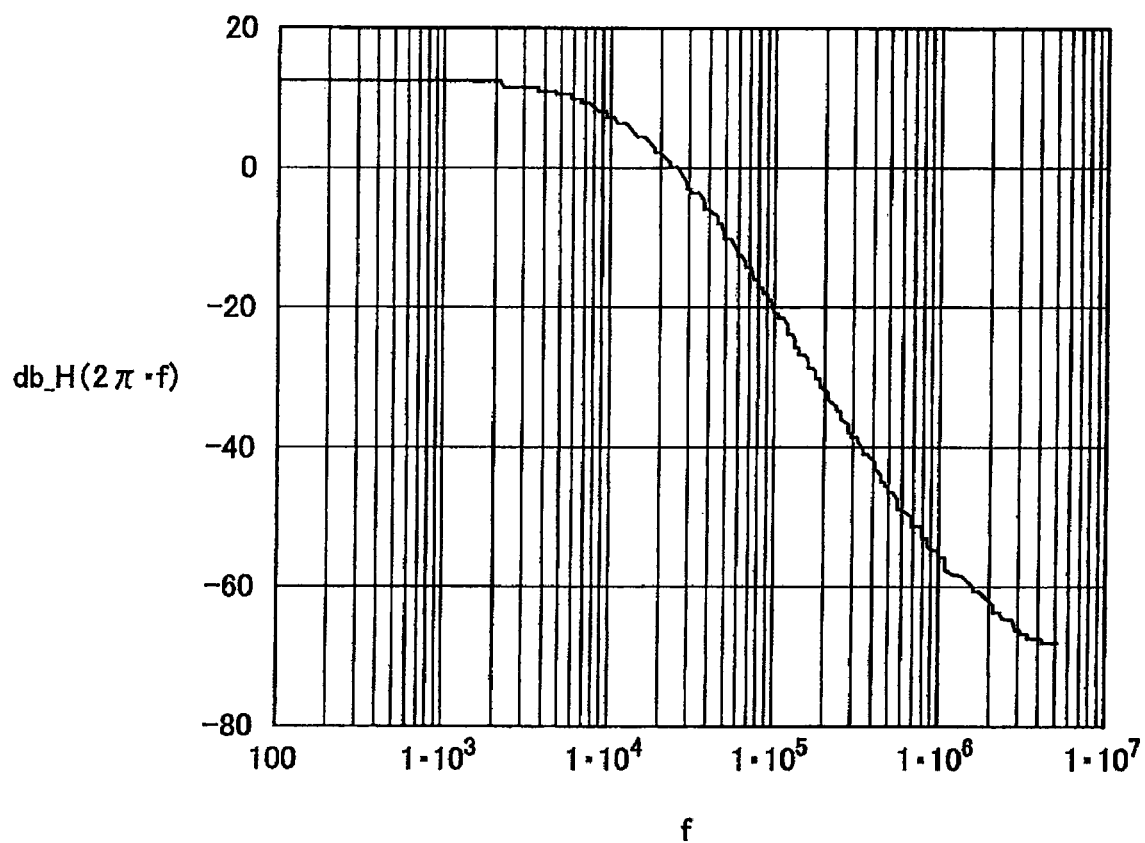
FIG. 9 is an explanatory figure that shows frequency characteristics for input and output voltages of a switched capacitor filter that is shown in FIG. 8.
Figure 10:
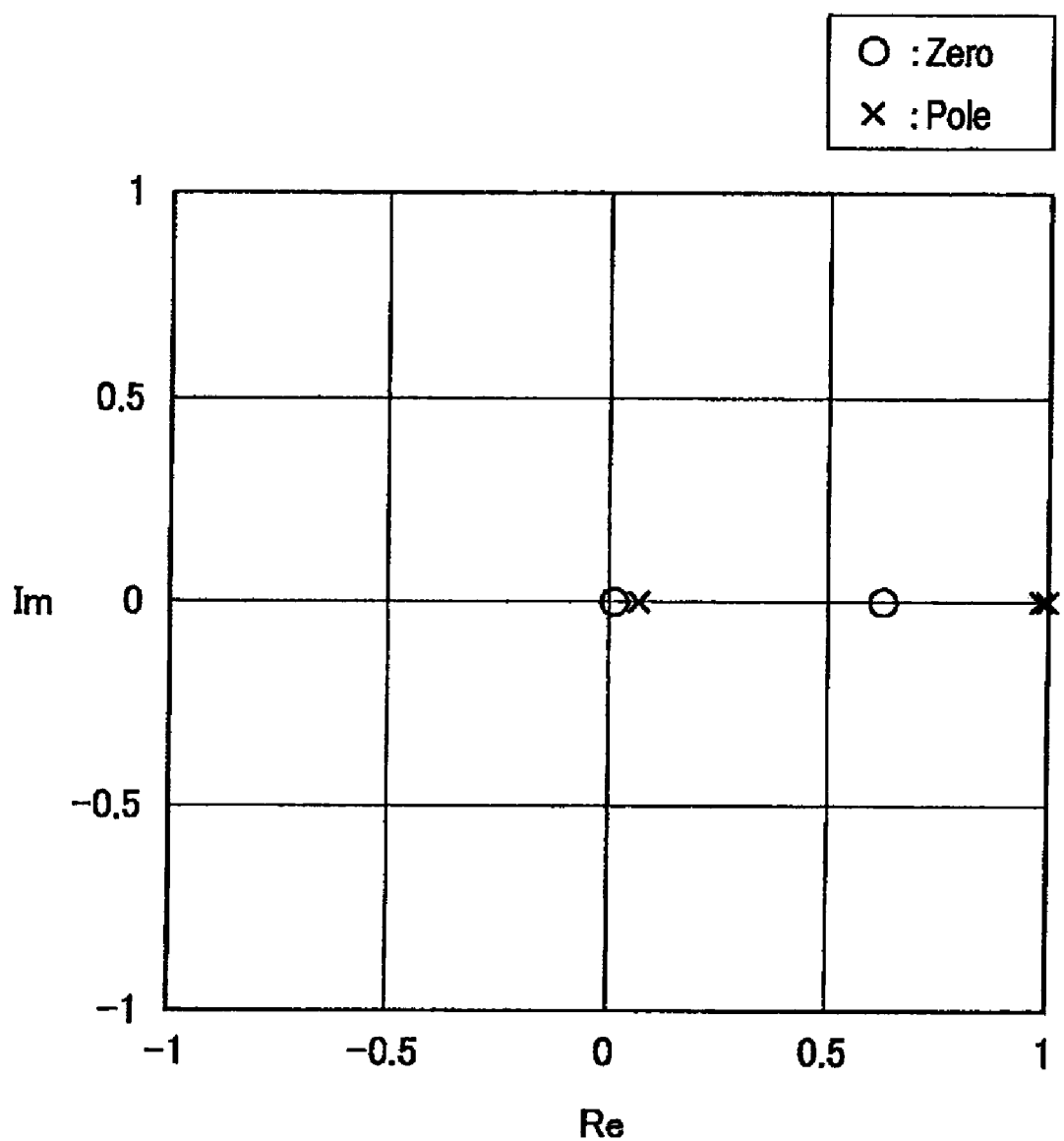
FIG. 10 is an explanatory figure that shows an arrangement of poles and zero points for the input and output voltages of the switched capacitor filter that is shown in FIG. 8.

The frequency characteristics of the switched capacitor filter 100b in a case where k=4 are shown in FIG. 9, and the arrangement of the poles and the zero points is shown in FIG. 10. In the graph of the frequency characteristics of the switched capacitor filter 100b shown in FIG. 9, the horizontal axis is the frequency, and the vertical axis is the gain. In FIG. 10, the horizontal axis is the real number axis (Re), the vertical axis is the imaginary number axis (Im), the position of each pole is indicated by x, and the position of each zero point is indicated by ○.

Looking at the arrangement of the poles and the zero points for the switched capacitor filter 100b, shown in FIG. 10, the positions of the poles are different from those in the arrangement of the poles and the zero points for the known loop filter 10a. However, a comparison of the frequency characteristics shows that the frequency characteristics have almost the same form, but it can be seen that the frequency characteristics for the switched capacitor filter 100b exhibit a gain of approximately 12 dB in the low frequency range. The 12 dB gain corresponds to the capacitance change ratio k of the capacitor $C_{R3}$ (which is 4 in this case). It is possible to change the value of the gain by changing the value of k.

As explained above, in the first embodiment of the present invention, even the passive type switched capacitor circuit that is configured only from passive elements can achieve a voltage gain that can not be achieved by the known switched capacitor filter. In addition, because the capacitances of the capacitors can be made smaller than in the known switched capacitor filter, the circuit can be mounted in a smaller surface area. Moreover, the frequency characteristics can be matched to the frequency characteristics of the known switched capacitor filter, so the same design techniques can be used as are used for the known filter.

Second Embodiment

In a second embodiment, a case will be explained in which a switched capacitor filter that is configured using the switched capacitor circuit of the present invention is used in a sigma-delta A/D converter.

Figure 20:
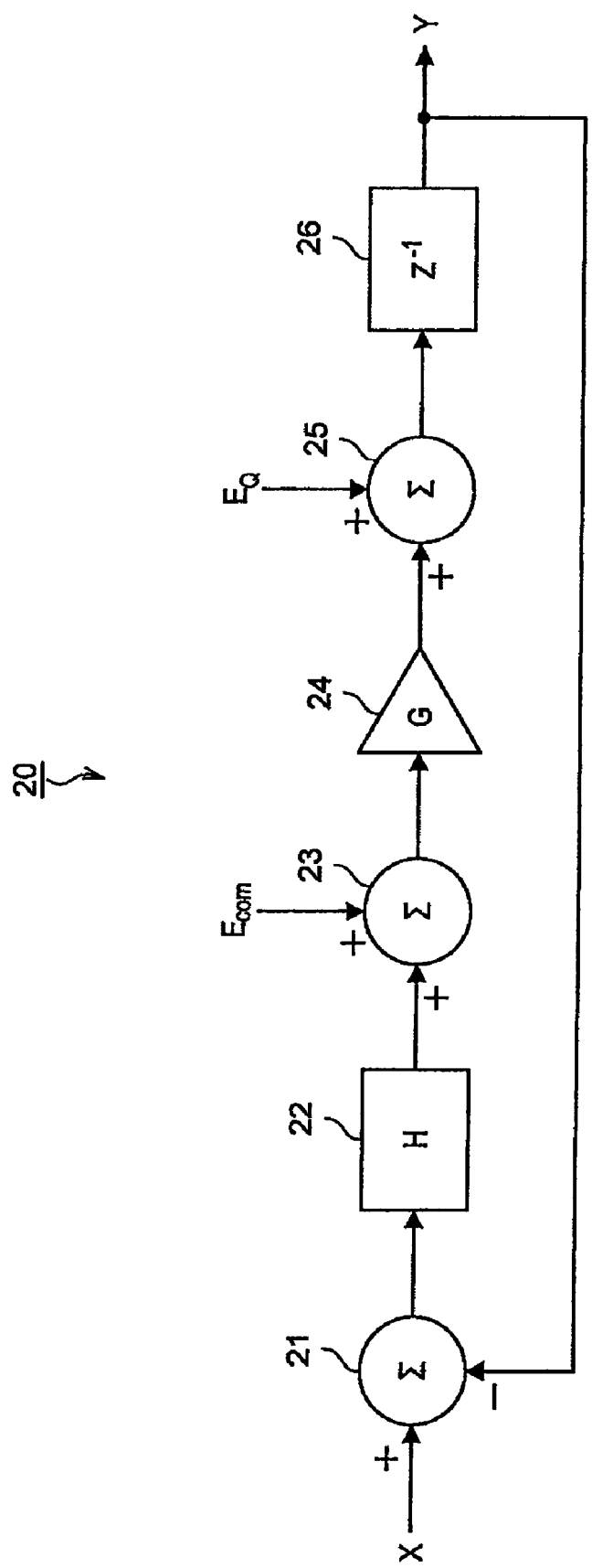
FIG. 20 is an explanatory figure that shows functional blocks of an ordinary passive type sigma-delta A/D converter 20.

Before the second embodiment of the present invention is explained, a configuration of an ordinary passive type sigma-delta A/D converter will be explained. FIG. 20 is an explanatory figure that shows functional blocks of an ordinary passive type sigma-delta A/D converter 20. As shown in FIG. 20, the sigma-delta A/D converter 20 is configured such that it includes a subtractor 21, a loop filter 22, adders 23, 25, a comparator 24, and a delay element 26. In FIG. 20, X indicates an analog input signal, and Y indicates a digital output signal. Further, H indicates a transfer function of the loop filter 22, G indicates a gain of the comparator 24, $E_{com}$ indicates noise of the comparator 24, and $E_Q$ indicates quantified noise. Note that the delay of the delay element 26 is, in effect, the quantified delay when A/D conversion is performed.

The transfer function of the passive type sigma-delta A/D converter 20 shown in FIG. 20 is as shown by Equation 3 below.

$$Y = \frac{GHz^{-1}}{1 + GHz^{-1}} X + \frac{Gz^{-1}}{1 + GHz^{-1}} E_{COM} + \frac{z^{-1}}{1 + GHz^{-1}} E_Q \quad \text{Equation 3}$$

In a case where a gain G of the comparator 24 is sufficiently large, Equation 3 can be expressed as Equation 4.

$$Y \approx X + \frac{E_{COM}}{H} + \frac{E_Q}{GH}, (G \gg 1) \quad \text{Equation 4}$$

Based on Equation 4, it can be seen that the quantified noise $E_Q$ is suppressed to a value equal to 1 divided by the comparator gain G, and that noise shaping is done by an inverse transfer function 1/H of the loop filter 22. For example, if the loop filter 22 is a low-pass filter, the quantified noise $E_Q$ will have the inverse high-pass characteristic, and the quantified noise $E_Q$ will be damped in the low range. In contrast, it can be seen from Equation 4 that the comparator noise $E_{com}$ is subject only to the noise shaping that is done by the inverse transfer function of the loop filter.

Figure 16:
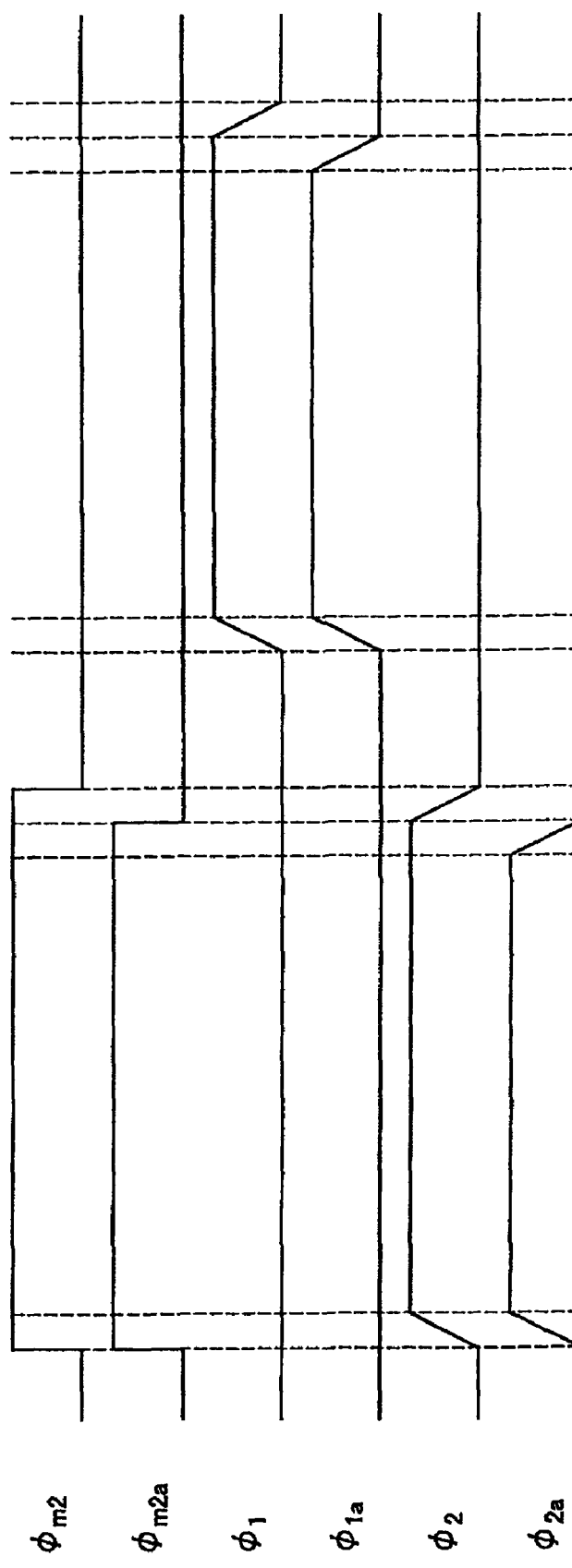
FIG. 16 is an explanatory figure that shows that shows waveforms of clock signals that are input to the loop filter that is shown in FIG. 15.
Figure 17:
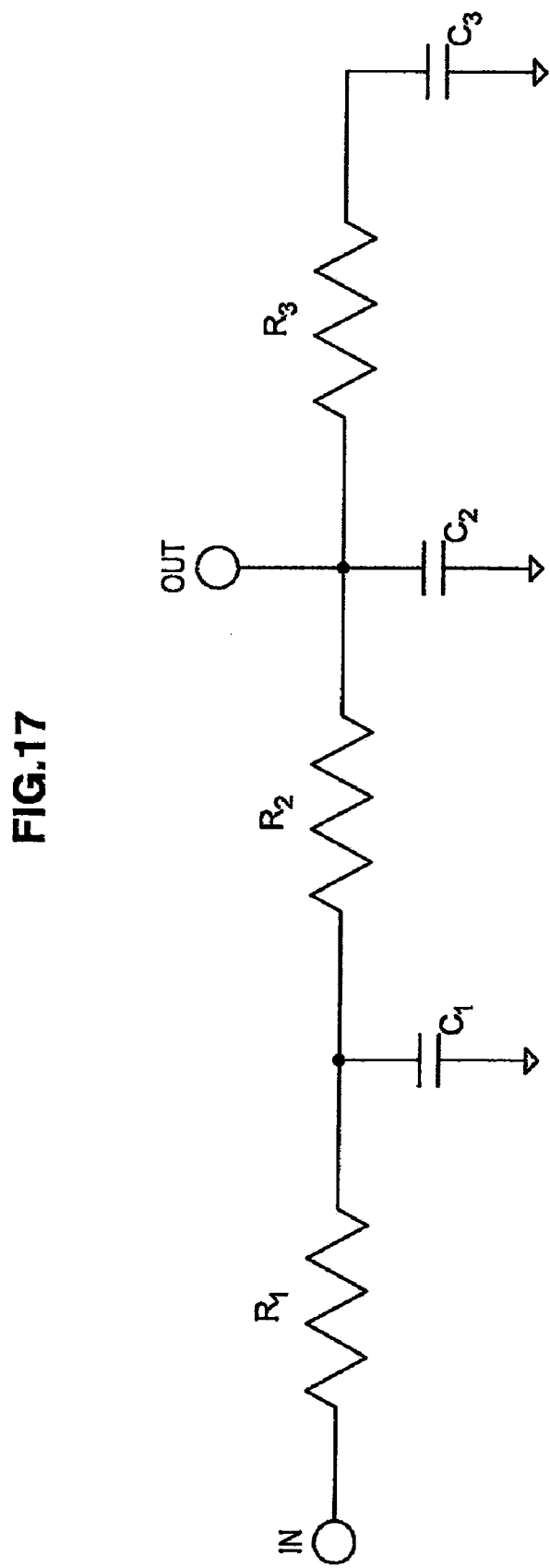
FIG. 17 is an explanatory figure for explaining how a continuous-time RC filter is used for the loop filter that is shown in FIG. 15.
Figure 21:
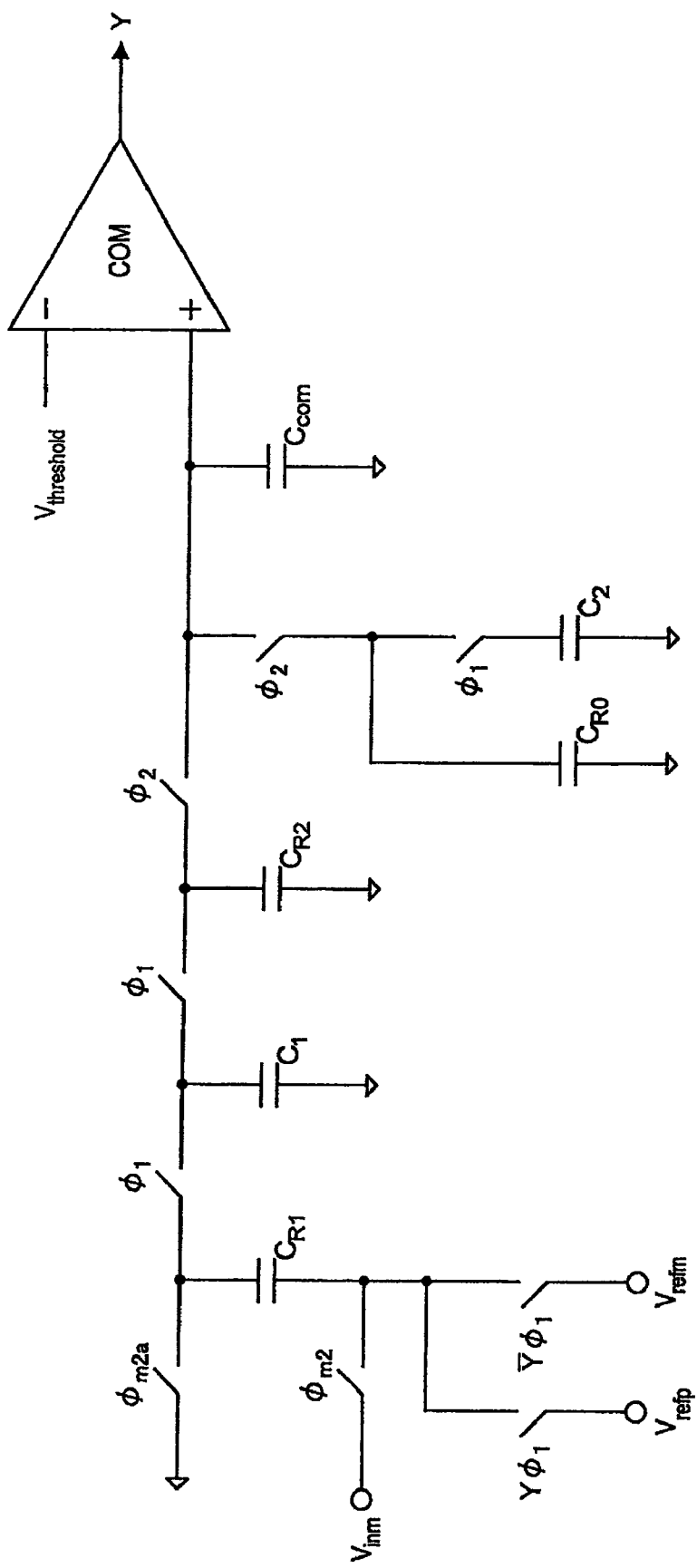
FIG. 21 is an explanatory figure that shows a configuration of a known passive type sigma-delta A/D converter.
Figure 22:
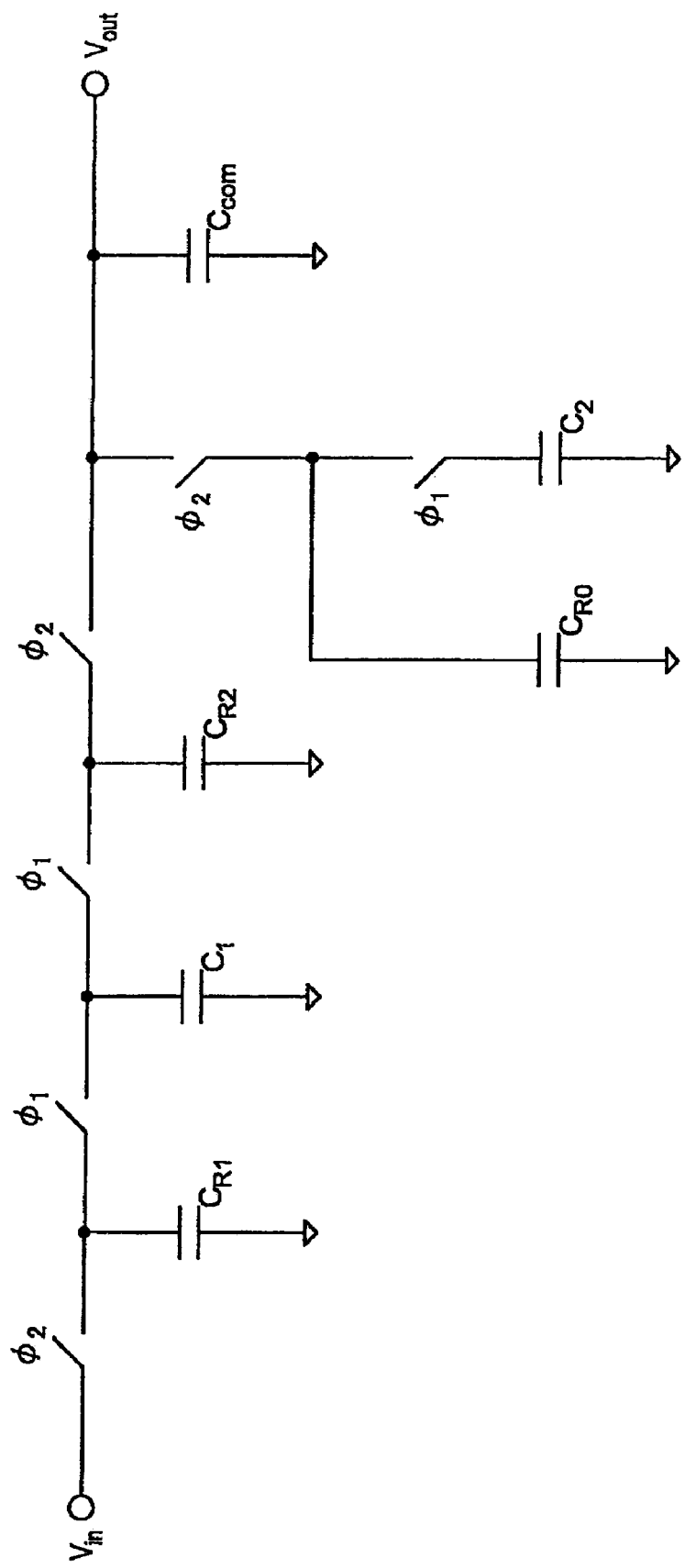
FIG. 22 is an explanatory figure that shows a circuit that is equivalent to the circuit shown in FIG. 21.

FIG. 21 is an explanatory figure that shows a configuration of a known passive type sigma-delta A/D converter that is described in Feng Chen, Bosco Leung, "A 0.25 mW 13b Passive ΣΔ Modulator for a 10 MHz IF Input," in IEEE Int. Solid State Circuits Conf. Dig. Tech. Papers, February 1996, pp. 58-59. The clock signals shown in FIG. 16 are input to the passive type sigma-delta A/D converter shown in FIG. 21. FIG. 22 shows a circuit that is equivalent to the circuit in FIG. 21 and that is created by extracting only the loop filter portion of the passive type sigma-delta A/D converter shown in FIG. 21. FIG. 22 shows a passive type switched capacitor filter that is configured from only switches and capacitors. The clock signals that are input to the switched capacitor filter in FIG. 22 are the same as the clock signals $\phi_1$, $\phi_2$ in FIG. 16.

As shown in Feng Chen, Bosco Leung, "A 0.25 mW 13b Passive ΣΔ Modulator for a 10 MHz IF Input," in IEEE Int. Solid State Circuits Conf. Dig. Tech. Papers, February 1996, pp. 58-59, the sampling frequency for the loop filter circuit that is shown in FIG. 22 is 10 MHz, the filter's poles are at 8 kHz and 34 kHz, and the zero point is at 750 kHz. Based on these conditions, the capacitances of the various capacitors in the loop filter circuit in FIG. 22 are calculated as 0.2 pF for $C_{R1}$, 23 pF for $C_1$, 0.125 pF for $C_{R2}$, 0.5 pF for $C_{com}$, 2.5 pF for $C_{R0}$, and 4.15 pF for $C_2$. At this time, the frequency characteristics for the input and output voltages are the same as those shown in FIG. 18.

Figure 18:
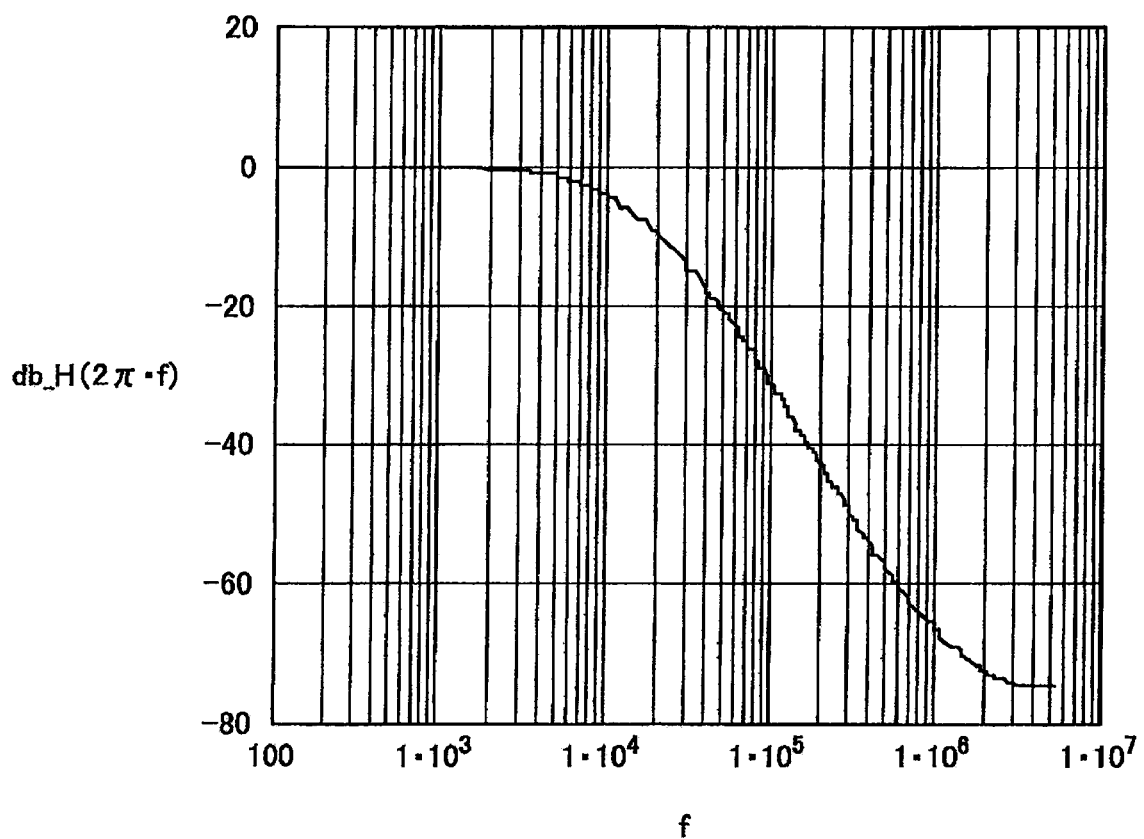
FIG. 18 is an explanatory figure that shows frequency characteristics for input and output voltages of the loop filter that is shown in FIG. 15.
Figure 19:
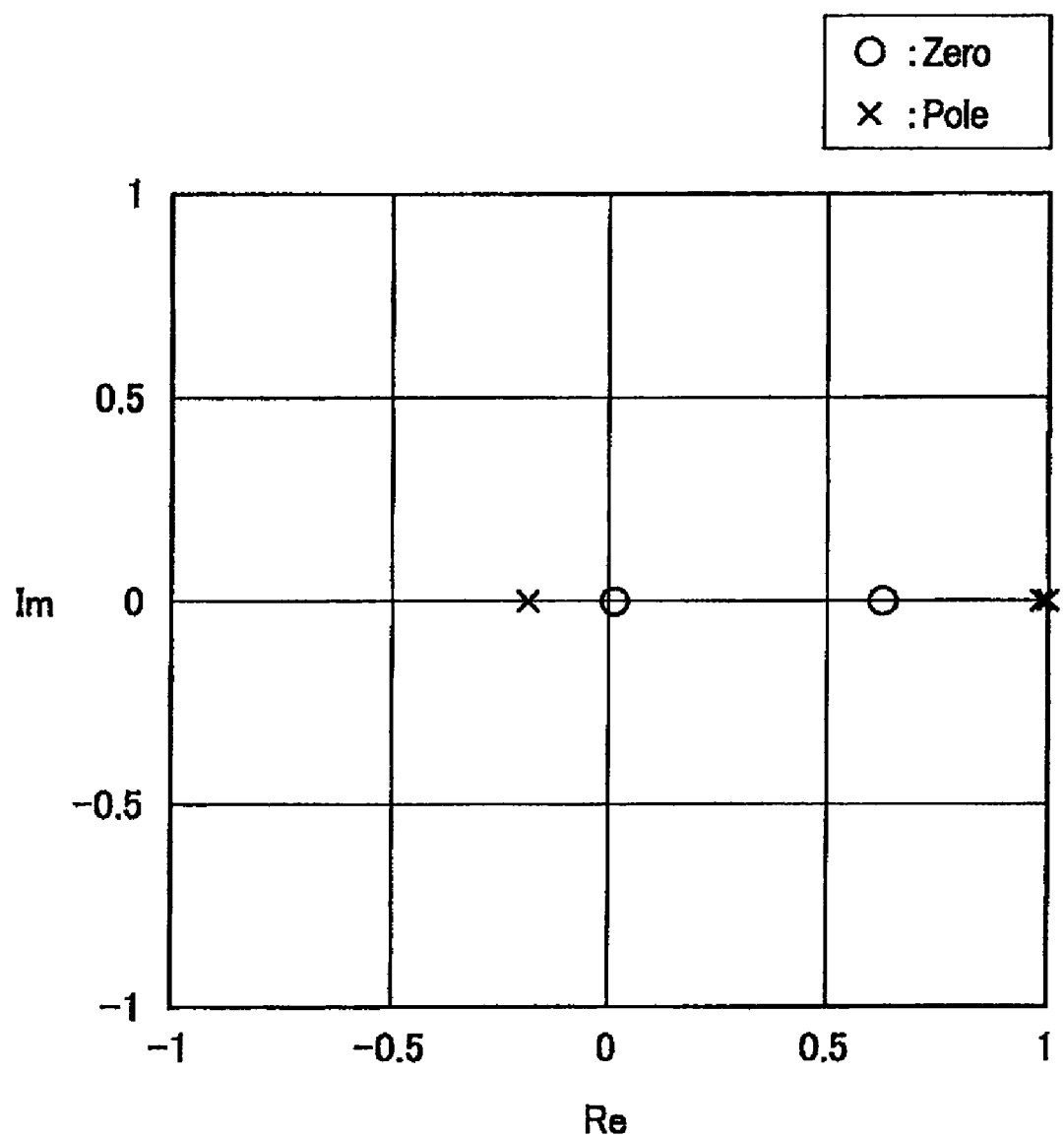
FIG. 19 is an explanatory figure that shows an arrangement of poles and zero points for the input and output voltages of the loop filter that is shown in FIG. 15.
Figure 23:
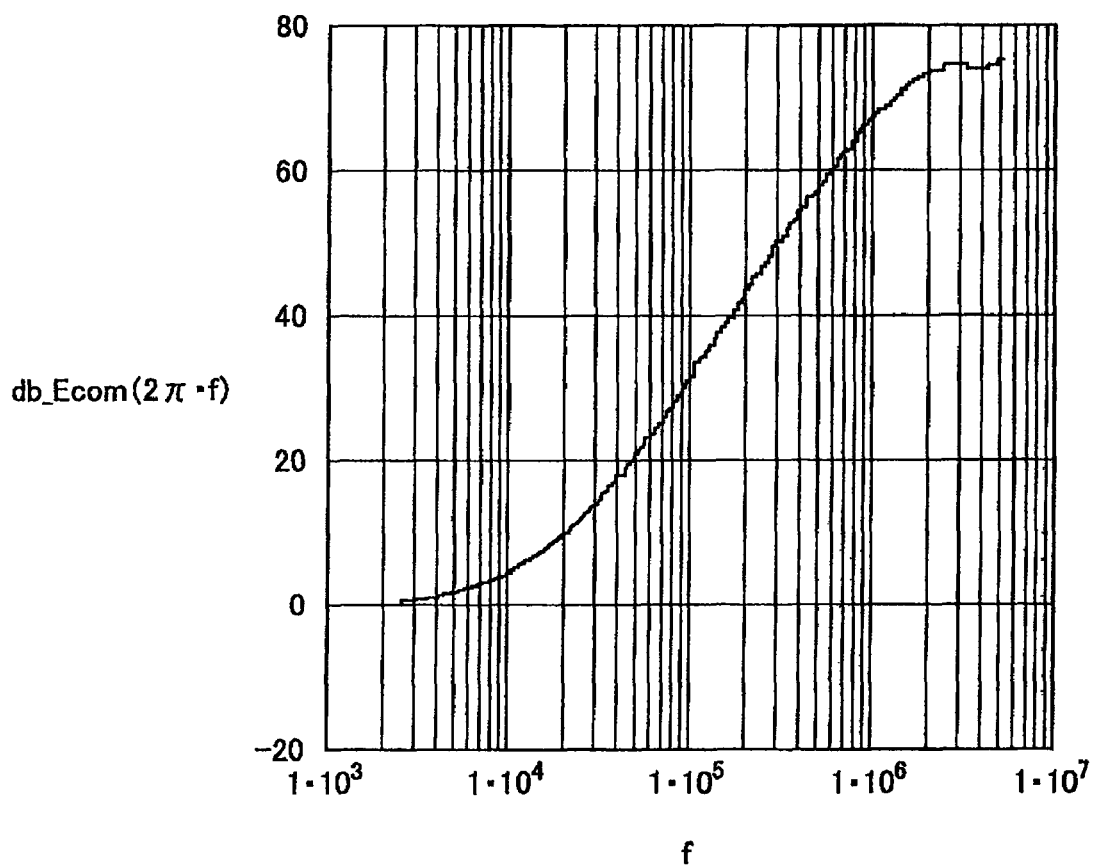
FIG. 23 is an explanatory figure that shows comparator noise transfer characteristics of a comparator in FIG. 22.

The transfer characteristics for the comparator noise, determined by using the frequency characteristics in FIG. 18 and assuming a value of 90 dB for the comparator gain G in Equation 3, are shown in FIG. 23. As shown in FIGS. 18 and 23, because there is no gain in the loop filter of the known passive type sigma-delta A/D converter, it can be seen that the comparator noise is output unchanged in the low frequency range and that the comparator noise is amplified as the frequency moves into the high range. This creates a problem in the known passive type sigma-delta A/D converter, in that the S/N dynamic range is restricted.

However, the switched capacitor filter of the present invention has gain in the low frequency range, so it can suppress the comparator noise in the low frequency range. A sigma-delta A/D converter according to the second embodiment of the present invention will be explained below.

Figure 11:
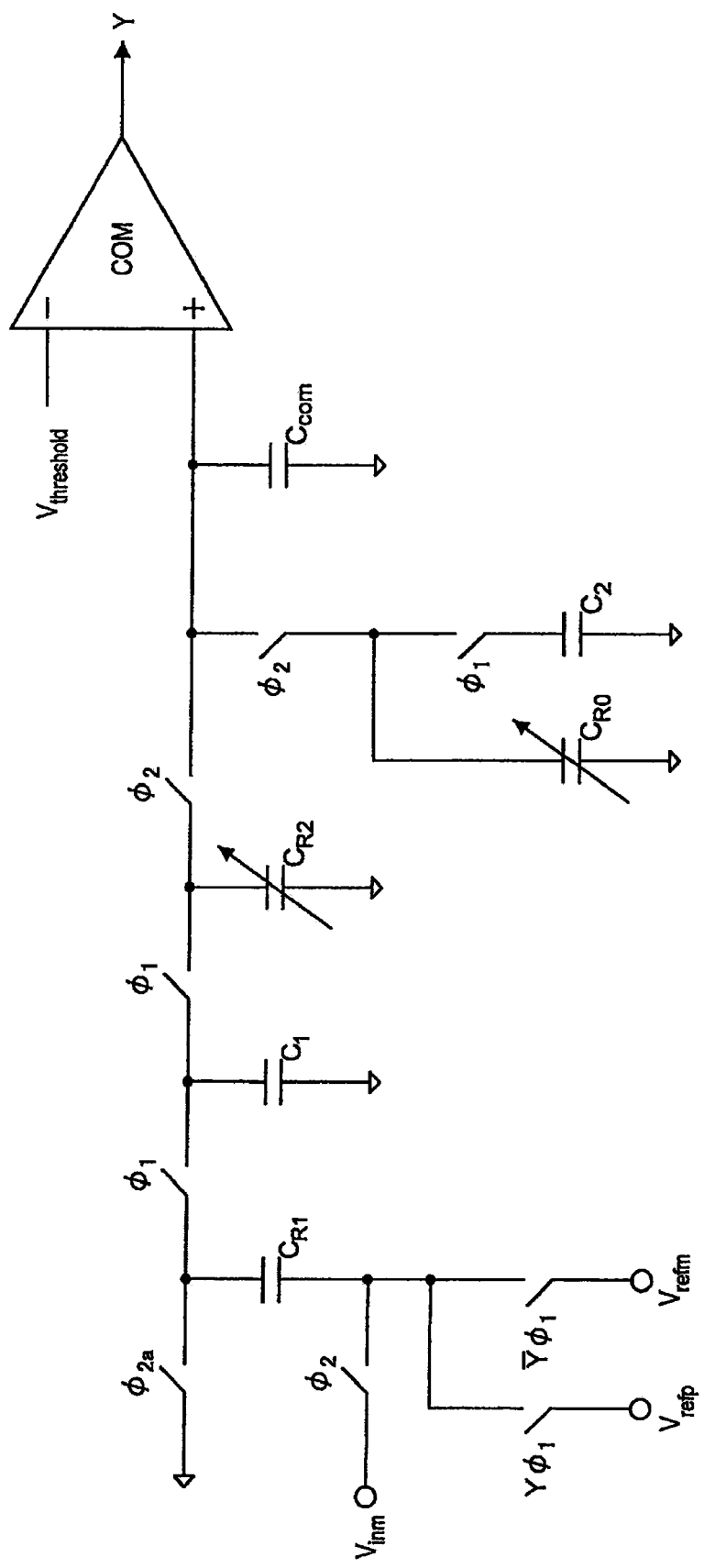
FIG. 11 is an explanatory figure for explaining a sigma-delta A/D converter according to a second embodiment of the present invention.

FIG. 11 is an explanatory figure for explaining a sigma-delta A/D converter 200 according to the second embodiment of the present invention. The sigma-delta A/D converter 200 shown in FIG. 11 differs from the known sigma-delta A/D converter that is shown in FIG. 21 in that variable capacitance elements are used for the capacitors $C_{R0}$, $C_{R2}$.

Figure 12:
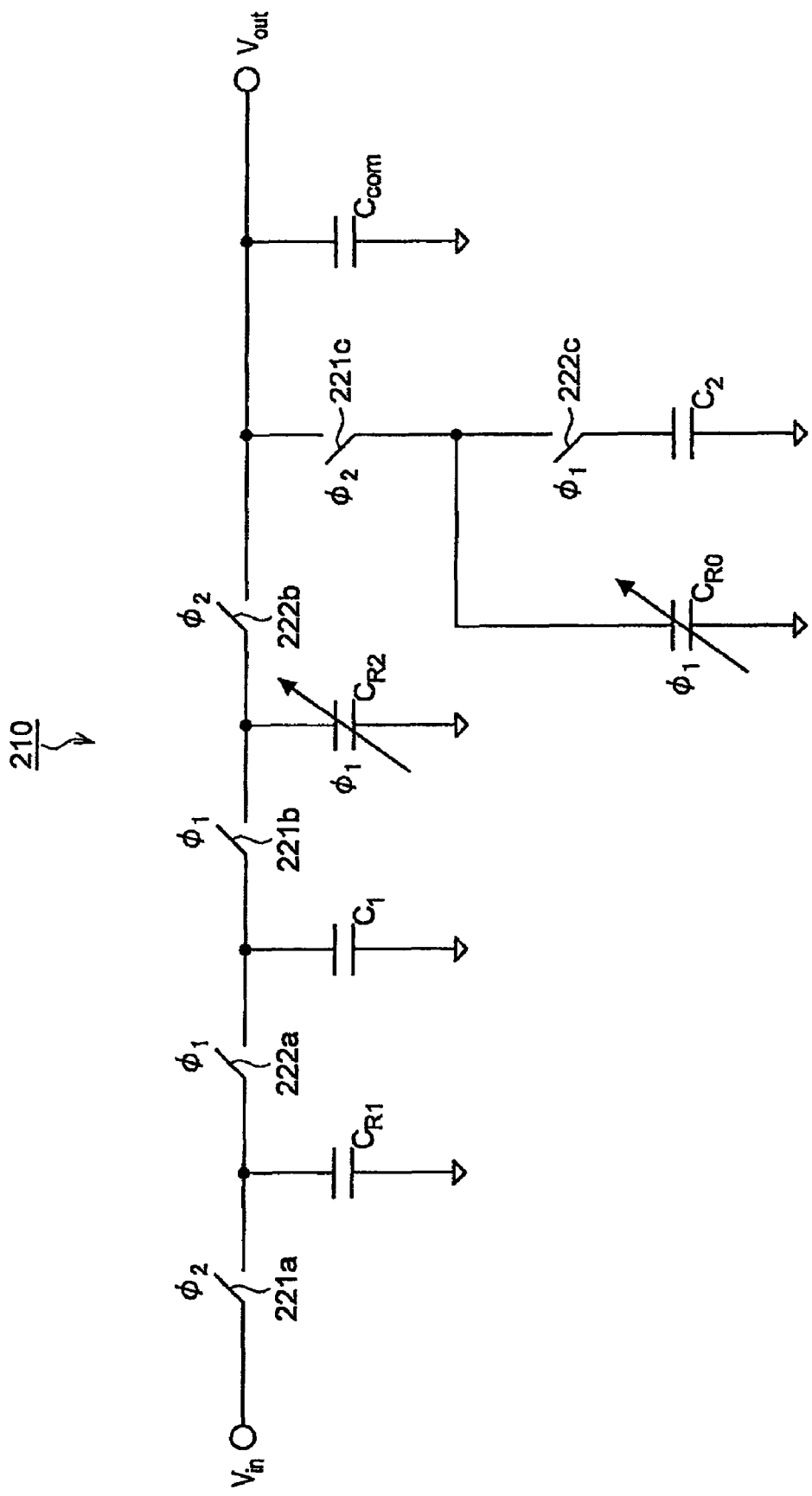
FIG. 12 is an explanatory figure that shows a circuit that is equivalent to the circuit shown in FIG. 11 and that is formed by extracting a loop filter from the circuit shown in FIG. 11.

FIG. 12 shows a circuit that is equivalent to the circuit in FIG. 11 and that is created by extracting only the loop filter portion, in the same manner as was done with the known sigma-delta A/D converter described above. FIG. 12 is an explanatory figure that shows a switched capacitor filter 210 that is used in the sigma-delta A/D converter 200 according to the second embodiment of the present invention. As shown in FIG. 12, the switched capacitor filter 210 differs from the loop filter that is shown in FIG. 22 in that the variable capacitance elements are used for the capacitors $C_{R0}$, $C_{R2}$. Note that the clock signals that are input to the switched capacitor filter 210 are the same as the clock signals $\phi_1$, $\phi_2$ that are shown in FIG. 16.

A variable capacitance element that is configured from MOS capacitors, like that shown in FIG. 4, for example, can be used as the variable capacitance element that is used for the capacitors $C_{R0}$, $C_{R2}$. The variable capacitance element that is shown in FIG. 4 is configured such that its capacitance when the clock signal $\phi_1$ is high is greater than its capacitance when the clock signal $\phi_2$ is high. Therefore, in the switched capacitor filter 210 that is shown in FIG. 12, the capacitances of the capacitors $C_{R0}$, $C_{R2}$ both become greater when the clock signal $\phi_1$ is high and switches 221b, 222c are closed, and the capacitances of the capacitors $C_{R0}$, $C_{R2}$ both become smaller when the clock signal $\phi_2$ is high and switches 222b, 221c are closed.

Assuming that the sum of the charges that are accumulated in the capacitors $C_{com}$, $C_{R0}$, $C_{R2}$ in the switched capacitor filter 210 shown in FIG. 12 is equal to the sum of the charges in the loop filter shown in FIG. 22, the decreases in the capacitances of the capacitors $C_{R0}$, $C_{R2}$ in the switched capacitor filter 210 when the clock signal $\phi_2$ is high and the switches 222b, 221c are closed will cause the output voltage to be amplified. Therefore, according to the second embodiment of the present invention, it is possible to configure the switched capacitor filter 210 such that it is a passive type switched capacitor filter that has gain.

The transfer function for the input and output voltages of the switched capacitor filter 210 shown in FIG. 12 is shown below.

$$H(z) = \frac{(1-\gamma z^{-1})\alpha\beta \frac{C_{R1}C_{R2}}{C_1 C_{com}} z^{-1.5}}{(1-\alpha z^{-1})(1-\beta z^{-1})(1-\gamma z^{-1})-} \quad \text{Equation 5}$$
$$(1-\gamma z^{-1})\alpha\beta \frac{C_{R2}C_{r2}}{C_1 C_{com}} z^{-2} -$$
$$(1-\alpha z^{-1})\beta\gamma \frac{C_{R0}C_{r0}}{C_{com}C_2} z^{-2}$$

$$\alpha = \frac{C_1}{C_1 + C_{R1} + C_{R2}}, \ \beta = \frac{C_{com}}{C_{com} + C_{r2} + C_{r0}},$$
$$\gamma = \frac{C_2}{C_2 + C_{R0}}$$

Figure 13:
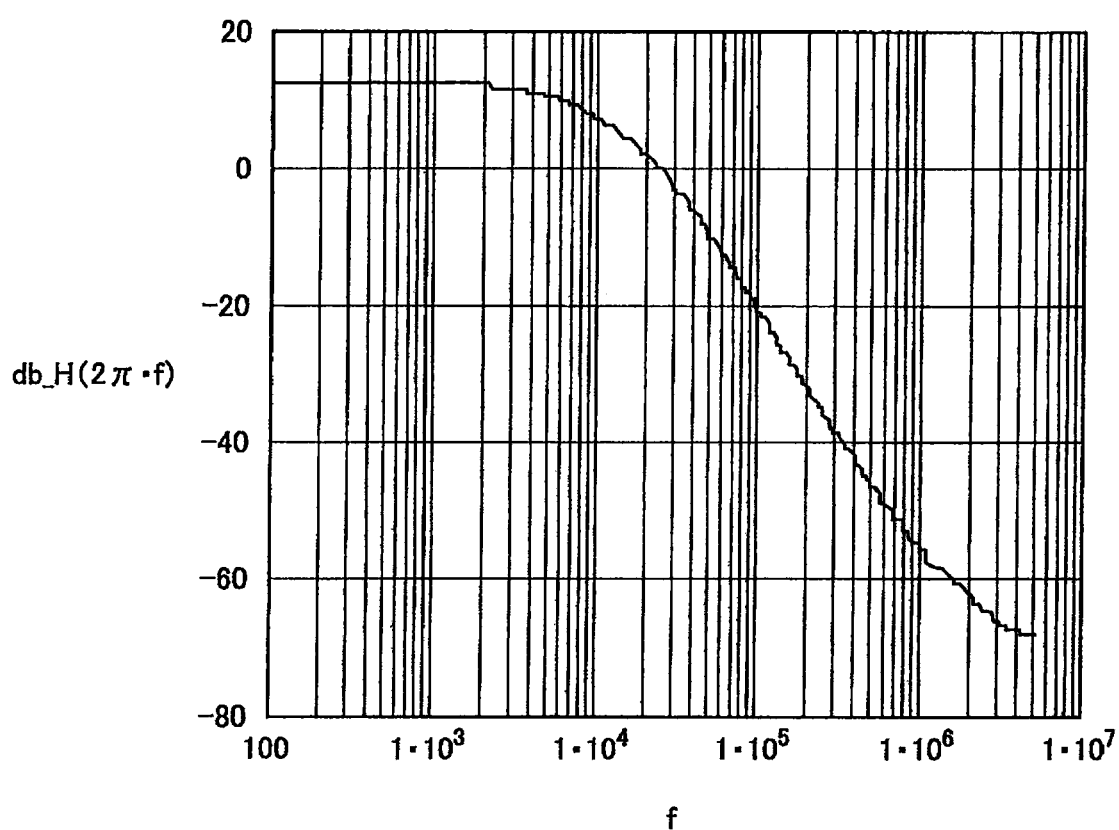

Note that $C_{R0}$, $C_{R2}$ indicate the capacitance values when the capacitances of the capacitors $C_{R0}$, $C_{R2}$ are in a high state, and $C_{r0}$, $C_{r2}$ indicate the capacitance values when the capacitances of the capacitors $C_{R0}$, $C_{R2}$ are in a low state. Therefore, in the same manner as in the loop filter in the known sigma-delta A/D converter, the capacitance values for the various capacitors are 0.2 pF for $C_{R1}$, 23 pF for $C_1$, 0.125 pF for $C_{R2}$, 0.5 pF for $C_{com}$, 2.5 pF for $C_{R0}$, and 4.15 pF for $C_2$. Furthermore, if the capacitance change ratio for the capacitors $C_{R0}$, $C_{R2}$ in the present embodiment is assumed to be 4, then $C_{r0}$ becomes 0.625 pF and $C_{r2}$ becomes 0.03125 pF. If these values are substituted into the equation above, then frequency characteristics like those shown in FIG. 13 are achieved. The frequency characteristics of the switched capacitor filter 210, shown in FIG. 13, have the same sort of properties as the frequency characteristics of the known loop filter shown in FIG. 18, but it can be seen that a gain of 12 dB is achieved in the low frequency range. The 12 dB gain corresponds to the capacitance change ratio of the capacitors $C_{R0}$, $C_{R2}$ (which is 4 in this case), and the value of the gain can be changed by changing the value of the capacitance change ratio.

Figure 14:
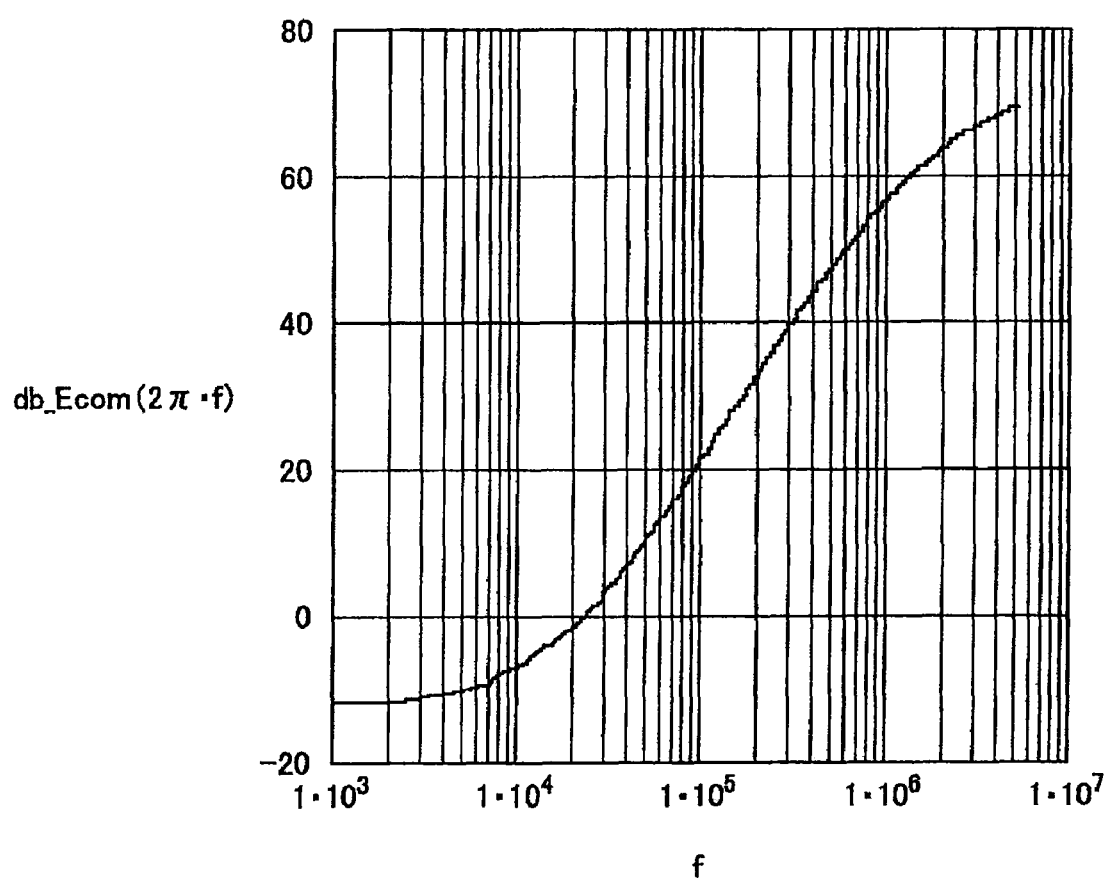
FIG. 14 is an explanatory figure that shows comparator noise transfer characteristics of a comparator in FIG. 12.

The transfer characteristics for the comparator noise in the sigma-delta A/D converter 200 according to the second embodiment of the present invention, determined by using Equation 3 with a value of 90 dB for the comparator gain G, in the same manner as in FIG. 23, are shown in FIG. 14. As shown in FIG. 14, the transfer characteristics for the comparator noise in the sigma-delta A/D converter 200 according to the second embodiment of the present invention differ from the comparator noise transfer characteristics that are shown in FIG. 23 for the known passive type sigma-delta A/D converter. It can be seen that the comparator noise is suppressed in the low frequency range. The S/N dynamic range of the sigma-delta A/D converter 200 according to the second embodiment of the present invention is therefore greater than that of the known passive type sigma-delta A/D converter.

As explained above, according to the second embodiment of the present invention, the comparator noise that is a problem in the known passive type sigma-delta A/D converter can be suppressed by using variable capacitance elements for the capacitors in the loop filter. This makes it possible to expand the S/N dynamic range more than can be done with the known passive type sigma-delta A/D converter. At the same time, because the filter is configured from only switches and capacitors, in the same manner as the known passive type sigma-delta A/D converter, high-speed operation can be achieved with low electric power consumption.

Note that one of a metal oxide semiconductor field-effect transistor (MOSFET) and a CMOSFET may be used for any one the switches in the embodiments described above.

It should be understood by those skilled in the art that various modifications, combinations, sub-combinations and alterations may occur depending on design requirements and other factors insofar as they are within the scope of the appended claims or the equivalents thereof.

What is claimed is:

1. A switched capacitor circuit that comprises a capacitor that performs sampling, a first switch that is provided between the capacitor and an input terminal, and a second switch that is provided between the capacitor and an output terminal,
wherein each of the first switch and the second switch receives an input of a clock signal and turns on and off at different times than when the other of the first switch and the second switch respectively turns on and off, and
the capacitor is a variable capacitance element in which the value of the capacitance changes in synchronization with the clock signal,
wherein the capacitance of the variable capacitance element when the first switch is on is greater than the capacitance of the variable capacitance element when the second switch is on.

2. The switched capacitor circuit according to claim 1,
wherein the variable capacitance element is configured from a metal oxide semiconductor (MOS) capacitor.

3. A switched capacitor filter, comprising:
a switched capacitor circuit that includes a capacitor that performs sampling, a first switch that is provided between the capacitor and an input terminal, and a second switch that is provided between the capacitor and an output terminal,
wherein each of the first switch and the second switch receives an input of a clock signal and turns on and off at different times than when the other of the first switch and the second switch respectively turns on and off, and
the capacitor is a variable capacitance element in which the value of the capacitance changes in synchronization with the clock signal,
wherein the capacitance of the variable capacitance element when the first switch is on is greater than the capacitance of the variable capacitance element when the second switch is on.

4. A switched capacitor filter, comprising:
a first switched capacitor circuit, a second switched capacitor circuit, and a third switched capacitor circuit, each including a capacitor that performs sampling, a first switch that is provided between the capacitor and an input terminal, and a second switch that is provided between the capacitor and an output terminal, and in each of which each of the first switch and the second switch receives an input of a clock signal and turns on and off at different times than when the other of the first switch and the second switch respectively turns on and off, and the capacitor is a variable capacitance element in which the value of the capacitance changes in synchronization with the clock signal;
a first capacitor;
a second capacitor; and
a third capacitor,
wherein the first switched capacitor circuit is provided in parallel with the first capacitor between the input terminal and the first capacitor,
the second switched capacitor circuit is provided in parallel with the second capacitor between the first capacitor and the second capacitor and between the first capacitor and the output terminal, and
the third switched capacitor circuit is provided in parallel with the second capacitor between the third capacitor and the second capacitor and between the third capacitor and the output terminal.

5. The switched capacitor filter according to claim 4,
wherein a transfer function is expressed by the equation $$H(z) = \frac{(1-\gamma \cdot z^{-1})\alpha\beta \cdot \frac{C_{R1}C_{R2}}{C_1 C_2} z^{-1.5}}{(1-\alpha \cdot z^{-1})(1-\beta \cdot z^{-1})(1-\gamma \cdot z^{-1}) -} \\ (1-\gamma \cdot z^{-1})\alpha\beta \cdot \frac{C_{R2}C_{r2}}{C_1 C_2} z^{-2} - \\ (1-\alpha \cdot z^{-1})\beta\gamma \cdot \frac{C_{R3}C_{r3}}{C_2 C_3} z^{-2}$$

$$\alpha = \frac{C_1}{C_1 + C_{r1} + C_{R2}}, \beta = \frac{C_2}{C_2 + C_{r2} + C_{R3}}, \gamma = \frac{C_3}{C_3 + C_{r3}},$$

wherein, $C_{R1}$, $C_{R2}$, $C_{R3}$ indicate the values of the capacitances in a case where the capacitances in the first to third switched capacitor circuits, respectively, are high, $C_{R1}$, $C_{R2}$, $C_{R3}$ indicate the values of the capacitances in a case where the capacitances in the first to third switched capacitor circuits, respectively, are low, and $C_{R1}$, $C_{R2}$, $C_{R3}$ indicate the values of the capacitances of the first to third capacitors, respectively.

6. A sigma-delta ND converter, comprising:
a switched capacitor filter that includes a switched capacitor circuit that includes a capacitor that performs sampling, a first switch that is provided between the capacitor and an input terminal, and a second switch that is provided between the capacitor and an output terminal, and in which each of the first switch and the second switch receives an input of a clock signal and turns on and off at different times than when the other of the first switch and the second switch respectively turns on and off, and the capacitor is a variable capacitance element in which the value of the capacitance changes in synchronization with the clock signal,
wherein the switched capacitor filter is used as a loop filter that integrates a difference between an analog input signal and an analog return signal;
wherein the capacitance of the variable capacitance element when the first switch is on is greater than the capacitance of the variable capacitance element when the second switch is on.

* * * * *